(12) United States Patent
Chijiiwa et al.

(10) Patent No.: US 7,005,690 B2
(45) Date of Patent: Feb. 28, 2006

(54) SOLID-STATE IMAGE SENSOR

(75) Inventors: Masahiro Chijiiwa, Kawasaki (JP); Shigetoshi Takeda, Kawasaki (JP); Masaya Katayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/003,380

(22) Filed: Dec. 6, 2004

(65) Prior Publication Data

US 2006/0011956 A1  Jan. 19, 2006

(30) Foreign Application Priority Data

Jul. 16, 2004  (JP) ............................ 2004-210081

(51) Int. Cl.
*H01L 31/062* (2006.01)
*H01L 31/113* (2006.01)
(52) U.S. Cl. .................... 257/292; 257/291; 257/458; 257/69
(58) Field of Classification Search ............... None
See application file for complete search history.

(56) References Cited

U.S. PATENT DOCUMENTS 6,169,318 B1 * 1/2001 McGrath ............... 257/445

FOREIGN PATENT DOCUMENTS

| GB | 2 335 097 A | 9/1999 |
|----|-------------|--------|
| JP | 5-115047 | 5/1993 |
| JP | 5-129572 | 5/1993 |
| JP | 11-317667 | 11/1999 |
| JP | 2002-199289 | 7/2002 |
| JP | 2002-329854 | 11/2002 |
| JP | 2002-334974 | 11/2002 |

\* cited by examiner

*Primary Examiner*—Tu-Tu Ho
(74) *Attorney, Agent, or Firm*—Westerman, Hattori, Daniels & Adrian, LLP

(57) ABSTRACT

The solid-state image sensor includes a pixel part 10, an analog circuit part 12, a digital circuit part 14 and an input/output circuit part 16. The digital circuit part 14 includes a first well 42c of a second conduction type formed in a second region of a semiconductor substrate 20 of a first conduction type surrounding a first region thereof; a first buried diffused layer 40c of the second conduction type buried in the first region: a second well 44b of the first conduction type formed near a surface of the semiconductor substrate 20 in the first region; and a first transistor 38e formed on the second well 44b.

14 Claims, 37 Drawing Sheets

SOLID-STATE IMAGE SENSOR

CROSS-REFERENCE TO RELATED APPLICATION

This application is based upon and claims priority of Japanese Patent Application No. 2004-210081, filed on Jul. 16, 2004, the contents being incorporated herein by reference.

BACKGROUND OF THE INVENTION

The present invention relates to a solid-state image sensor, more specifically a solid-state image sensor having the image quality improved.

The solid-state image sensors using semiconductor are largely classified in the CCD and the CMOS image sensor based on CMOS.

The CMOS image sensor mainly comprises a pixel array part including pixels having photodiodes formed in a matrix, a black pixel array part including pixels shielded from light, an analog circuit part for processing analog signals outputted from the pixel array part, a digital circuit part for processing signals outputted from the analog circuit part, and an input/output circuit part for inputting and outputting signals to and from the outside. The black pixel array part is for ensuring a reference level of black color.

The CMOS image sensor is much noted because of the much lower electric power consumption than the CCD.

Following references disclose the background art of the present invention.

[Patent Reference 1]
Specification of Japanese Patent Application Unexamined Publication No. 2002-329854

[Patent Reference 2]
Specification of Japanese Patent Application Unexamined Publication No. Hei 11-317667/1999

However, the conventional CMOS image sensor has not been always able to have good image quality.

SUMMARY OF THE INVENTION

An object of the present invention is to provide a solid-state image sensor having the image quality improved.

According to one aspect of the present invention, there is provided a solid-state image sensor comprising: a pixel part including photoelectric converter for photoelectrically converting incident light, which is formed in a semiconductor substrate of a first conduction type; an analog circuit part for processing an analog signal outputted by the pixel part; a digital circuit part for digital processing a signal outputted by the analog circuit part; and an input/output circuit part for inputting a signal to an outside or outputting a signal from the outside, the digital circuit part including a first well of a second conduction type different from the first conduction type formed in a second region of the semiconductor substrate surrounding a first region thereof; a first buried diffused layer of the second conduction type buried in the semiconductor substrate in the first region and connected to the first well at the side thereof; a second well of the first conduction type formed near a surface of the semiconductor substrate of the first region; and a first transistor formed on the second well; and the input/output circuit part including a third well of the second conduction type formed in a fourth region of the semiconductor substrate surrounding a third region; a second buried diffused layer of the second conduction type buried in the semiconductor substrate in the third region and connected to the third well at the side thereof; a fourth well of the first conduction type formed near the surface of the semiconductor substrate in the third region; and a second transistor formed on the fourth well.

According to another aspect of the present invention, there is provided a solid-state image sensor comprising: a pixel part including photoelectric converter for photoelectrically converting incident light, which is formed in a semiconductor substrate of a first conduction type; an analog circuit part for processing an analog signal outputted by the pixel part; a digital circuit part for digital processing a signal outputted by the analog circuit part; and an input/output circuit part for inputting a signal to an outside or outputting a signal from the outside, the digital circuit part including a first well of a second conduction type different from the first conduction type formed in the semiconductor substrate; a second well of the first conduction type formed in the first well; and a first transistor formed on the second well, and the input/output circuit part including a third well of the second conduction type formed in the semiconductor substrate; a fourth well of the first conduction type formed in the third well; and a second transistor formed on the fourth well.

According to the present invention, the second well of the first conduction type of the digital circuit part is electrically isolated from the pixel part by the first well of the second conduction type and the first buried diffused layer of the second conduction type, and the fourth well of the first conduction type of the input/output circuit part is electrically isolated from the pixel part by the third well of the second conduction type and the second buried diffused layer of the second conduction type, whereby the pixel part can be kept from the influence of noises. Furthermore, the buried diffused layers, etc. are not formed below the photoelectric converter of the pixel part, whereby the photoelectric conversion can be highly efficient. Thus, the present invention can provide a solid-state image sensor which can improve the image quality.

According to the present invention, the second well of the first conduction type of the digital circuit part is electrically isolated from the pixel part by the first well of the second conduction type, and the fourth well of the first conduction type of the input/output part is electrically isolated from the third well of the second conduction type, whereby the pixel part can be kept form the influence of noises. Furthermore, no well is formed below the photoelectric converter of the pixel part, whereby the photoelectric conversion can be highly efficient. Thus, the present invention can provide a solid-state image sensor which can improve the image quality.

DETAILED DESCRIPTION OF THE INVENTION

A First Embodiment

Figure 1:
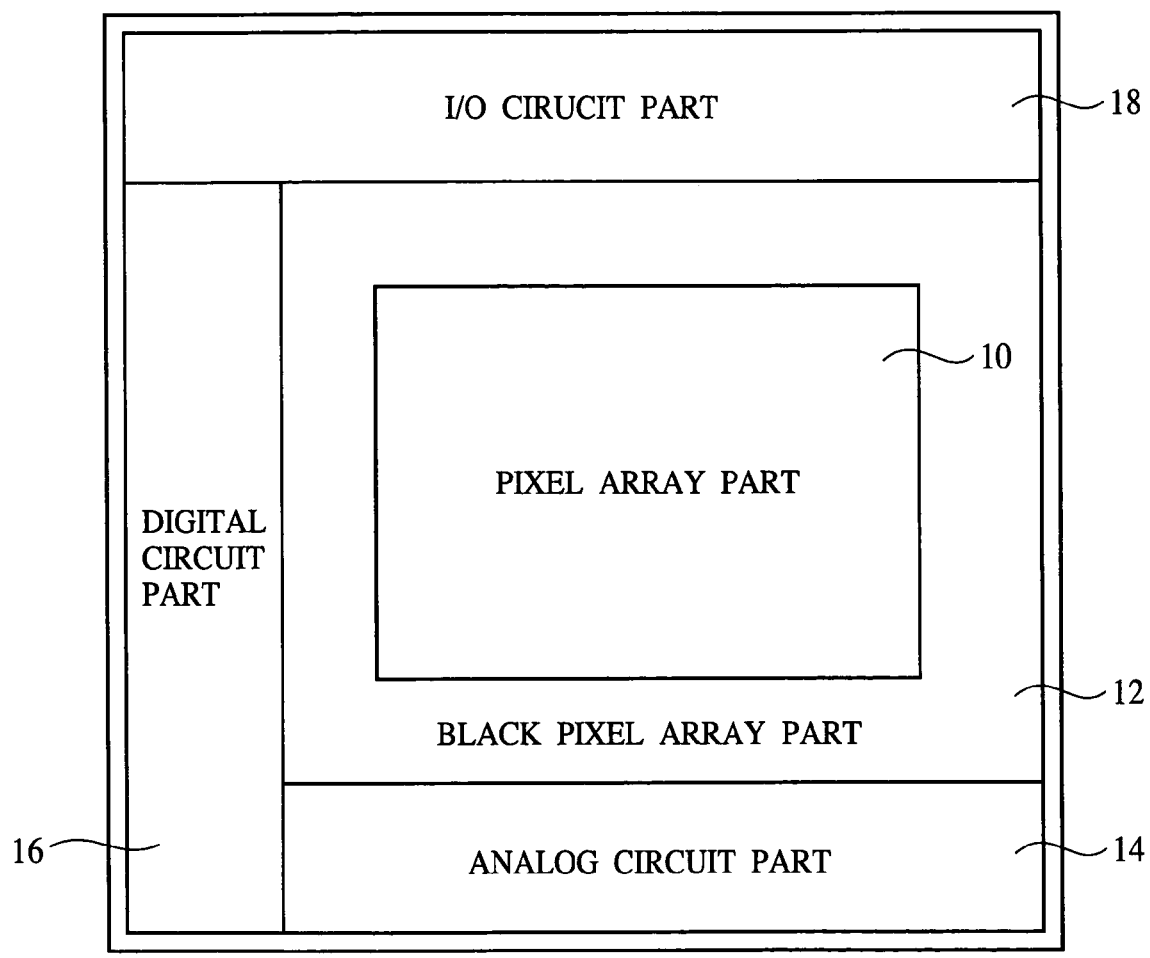
FIG. 1 is a plan view of the solid-state image sensor according to a first embodiment of the present invention.
Figure 2:
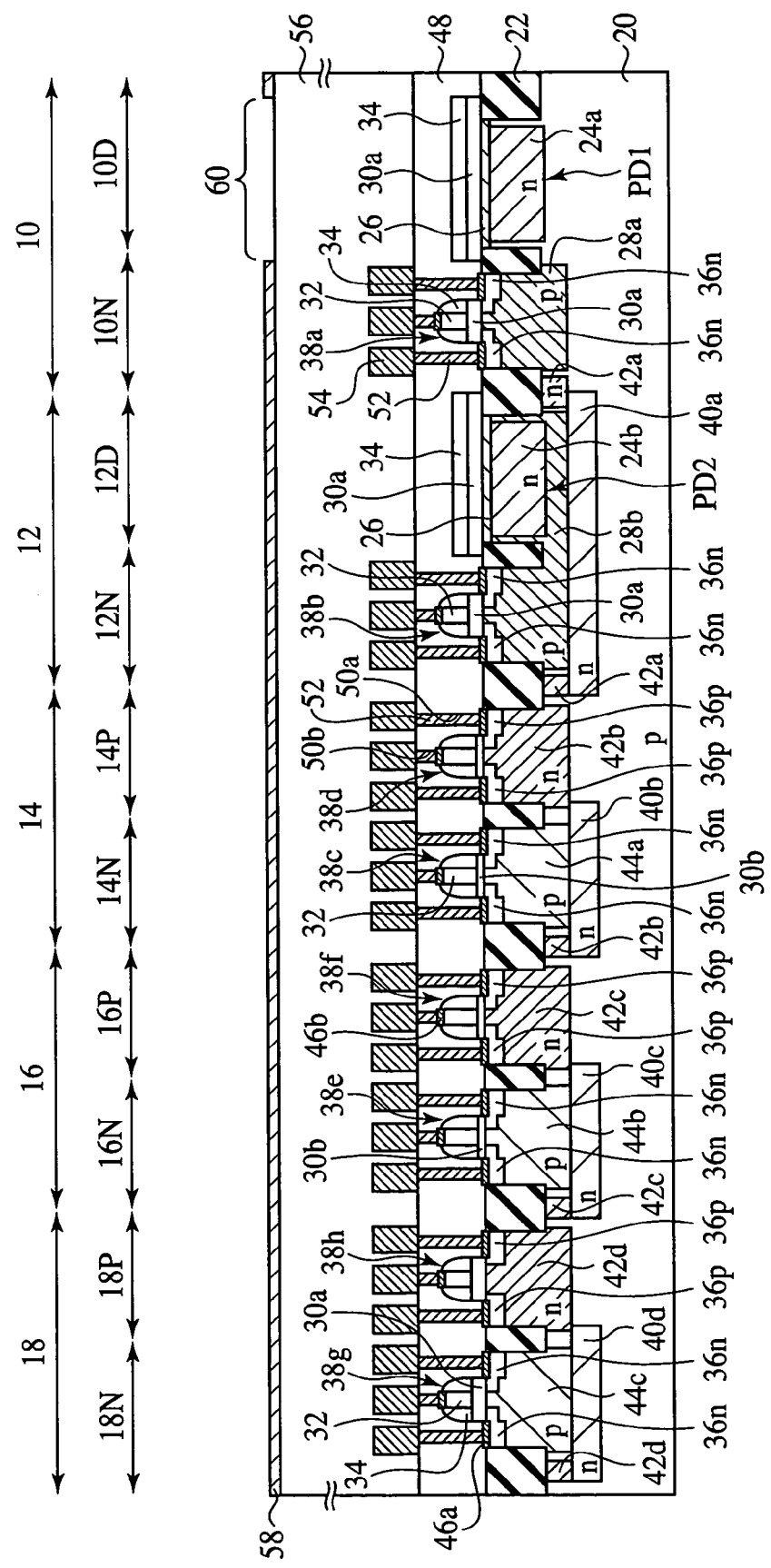
FIG. 2 is a sectional view of the solid-state image sensor according to the first embodiment of the present invention.

The solid-state image sensor according to a first embodiment of the present invention will be explained with reference to FIGS. 1 to 20. FIG. 1 is a plan view of the solid-state image sensor according to the present embodiment. FIG. 2 is sectional views of the solid-state image sensor according to the present embodiment.

(The Solid-State Image Sensor)

First, the solid-state image sensor according to the present embodiment will be explained with reference to FIGS. 1 and 2.

As illustrated in FIG. 1, the solid-state image sensor according to the present embodiment mainly comprises a pixel array part 10, a black pixel array part 12, an analog circuit part 14, a digital circuit part 16 and an I/O circuit part (input/output circuit part) 18.

The pixel array part 10 is a region for taking images, and a plurality of pixels are formed in a matrix there.

The black pixel array part 12 is for taking signals which are to a reference of black color. In the black pixel array part 12, pixels shielded from light with a shield film 58 (see FIG. 2) is formed.

In the present embodiment, the pixels of the black pixel array part 12 are shielded from light with the shield film 58. However, the pixels of the black pixel array part may be shielded from light with an interconnection layer formed solidly.

The analog circuit 14 is for processing analog signals, etc. outputted from the pixel part. The analog circuit part 14 comprises, e.g., an amplification circuit for amplifies detected light signals, a signal read/noise cancellation circuit for reading signals or canceling noises, an A/D converter for converting analog signals to digital signals, etc. In the signal read/noise cancellation circuit, noises are cancelled by, e.g., CDS (Correlated Double Sampling).

The digital circuit part 16 is for digitizing signals, etc. outputted from the analog circuit part 14 and other processing. In the digital circuit part 16, a processor unit for making prescribed signal processing, a timing generator for deciding a timing of reading signals, an SRAM circuit for memorizing data, etc. are formed.

The I/O circuit part 18 is for inputting/outputting signals to/from the outside.

In FIG. 2, on the right side of the drawing, the pixel array part 10 is illustrated. On the left side of the pixel array part 10, the black pixel array part 12 is illustrated. On the left side of the black pixel array part 12, the analog circuit part 14 is illustrated. On the left side of the analog circuit 14, the digital circuit 16 is illustrated. On the left side of the digital circuit 16, the I/O circuit part 18 is illustrated.

The region 10D of the pixel array part 10 on the right side of the drawing is a region where a photodiode (photoelectric conversion device) PD1 is formed, and the region 10N of the pixel array part 10 on the left side of the drawing is a region where an NMOS transistor is formed.

The region 12D of the black pixel array part 12 on the right side of the drawing is a region where a photodiode PD2 is formed, and the region 12N of the black pixel array part 12 on the left side of the drawing is a region where an NOMS transistor is formed.

The region 14P of the analog circuit part 14 on the right side of the drawing is a region where a PMOS transistor is formed, and the region 14N of the analog circuit part 14 on the left side of the drawing is a region where an NMOS transistor is formed.

The region 16P of the digital circuit part 16 on the right side of the drawing is a region where a PMOS transistor is formed, and the region 16N of the digital circuit part 16 on the left side of the drawing is a region where an NMOS transistor is formed.

The region 18P of the I/O circuit part 18 on the right side of the drawing is a region where a PMOS transistor is formed, and the region 18N of the I/O circuit part 18 on the left side of the drawing is a region where an NMOS transistor is formed.

Device isolation regions 22 for defining the device regions are formed on the surface of a P type semiconductor substrate 20.

In the region 10D of the pixel array part 10, where the photodiode is formed, an N type impurity diffused region 24a is formed in the semiconductor substrate 20. The N type impurity diffused region 24a forms the photodiode PD1. On the surface of the device region where the N type impurity diffused region 24a is formed, a P type impurity diffused layer 26 is formed. Silicon oxide films 30a, 34 are formed on the P type impurity diffused layer 26.

In the region 10N of the pixel array part 10, where the NMOS transistor is formed, a P type well 28a is formed. A gate electrode 32 is formed on the P type well 28a with the gate insulation film 30a formed therebetween. The N type lightly doped diffused layer is formed in the semiconductor substrate 20 on both sides of the gate electrode 32. A sidewall insulation film 34 is formed on the side wall of the gate electrode 32. The N type heavily doped diffused layer is formed in the semiconductor substrate 20 on both side of the gate electrode 32 with the sidewall insulation film 34 formed on. The N type lightly doped diffused layer and the N type heavily doped diffused layer form a source/drain diffused layer 36n of the LDD structure. Thus, the NMOS transistor 38a including the gate electrode 32 and the source/drain diffused layer 36n is formed. The NMOS transistor 38a forms a part of the read circuit of, e.g., the pixel array part 10.

In the semiconductor substrate 20 of the black pixel array part 12, an N type buried diffused layer 40a is formed. An N type well 42a is formed, surrounding the region between the surface of the semiconductor substrate 20 and the N type buried diffused layer 40a. The N type well 42a and the N type buried diffused layer 40a are connected to each other at the sides of the N type buried diffused layer 40a. A P type well 28b is formed in the region surrounded by the buried diffused layer 40a and the N type well 42a. The P type well 28b is formed in the region 12N, where the NMOS transistor is formed and also in the region 12D, where the photodiode is formed. The P type well 28b is isolated from the pixel array part 10 by the N type buried diffused layer 40a and the N type well 42a. This structure is called a triple well structure.

In the region 12D of the black pixel array part 12, where the photodiode is formed, an N type impurity diffused region 24b is formed in the P type well 28b. The P type impurity diffused layer 26 is formed on the surface of the device region where an N type impurity diffused region 24b is formed. The silicon oxide films 30a, 34 are formed on the P type impurity diffused layer 26.

In the region 12N of the black pixel array part 12, where the NMOS transistor is formed, a gate electrode 32 is formed on the P type well 28b with the gate insulation film 30 a formed therebetween. In the semiconductor substrate 20 on both side of the gate electrode 32, the N type lightly doped diffused layer is formed. The sidewall insulation film 34 is formed on the side wall of the gate electrode 32. The N type heavily doped diffused layer is formed in the semiconductor substrate 20 on both sides of the gate electrode 32 with the sidewall insulation film 34 formed on. The N type lightly doped diffused layer and the N type heavily doped diffused layer form the source/drain diffused layer 36n of the LDD structure. Thus, the NMOS transistor 38b including the gate electrode and the source/drain diffused layer 36n is formed. The NMOS transistor 38b forms a part of the read circuit of, e.g., the black pixel array part 12.

In the region 14N of the analog circuit region 14, where the NMOS transistor is formed, the N type buried diffused layer 40b is buried in the semiconductor substrate 20. An N type well 42b is formed, surrounding the region between the surface of the semiconductor substrate 20 and the buried diffused layer 40b. The N type well 42b is formed in the device region 14N, where the NMOS transistor is formed and also in the region 14P, where the PMOS transistor is formed. The N type well 42b and the buried diffused layer 40b are connected to each other at the sides of the buried diffused layer 40b. A P type well 44a is formed in the region surrounded by the buried diffused layer 40b and the N type well 42b. The P type well 44a is electrically isolated from the pixel array part 10 by the buried diffused layer 40b and the N type well 42b.

A gate electrode 32 is formed on the P type well 44a with the gate insulation film 30b. The N type lightly doped diffused layer is formed in the semiconductor substrate 20 on both sides of the gate electrode 32. The sidewall insulation film 34 is formed on the side wall of the gate electrode 32. The N type heavily doped diffused layer is formed in the semiconductor substrate 20 on both sides of the gate electrode 32 with the sidewall insulation film 34 formed on. The N type lightly doped diffused layer and the N type heavily doped diffused layer form the source/drain diffused layer 36n of the LDD structure. Thus, the NMOS transistor 38c including the gate electrode 32 and the source/drain diffused layer 36n is formed.

On the N type well 42b in the region 14P, where the PMOS transistor is formed, a gate electrode 32 is formed with the gate insulation film 30b formed therebetween. The P type lightly doped diffused layer is formed in the semiconductor substrate 20 on both sides of the gate electrode 32. The sidewall insulation film 34 is formed on the side wall of the gate electrode 32. The P type heavily doped diffused layer is formed in the semiconductor substrate 20 on both sides of the gate electrode 32 with the sidewall insulation film 34 formed on. The P type lightly doped diffused layer and the P type heavily doped diffused layer form the source/drain diffused layer 36p of the LDD structure. Thus, the PMOS transistor 38d including the gate electrode 32 and the source/drain diffused layer 36p is formed. The NMOS transistor 38c and the PMOS transistor 38d form the CMOS circuit.

In the region 16N of the digital circuit part 16, where the NMOS transistor is formed, the N type buried diffused layer 40c is buried in the semiconductor substrate 20. An N type well 42c is formed, surrounding the region between the surface of the semiconductor substrate 20 and the buried diffused layer 40c. The N type well 42c is formed in the device region 16N, where the NMOS transistor is formed and also in the region 16P, where the PMOS transistor is formed. The buried diffused layer 40c and the N type well 42c are connected to each other at the side of the buried diffused layer 40c. A P type well 44b is formed in the region surrounded by the buried diffused layer 40c and the N type well 42c. The P type well 44b is electrically isolated from the pixel array part 10 by the buried diffused layer 40c and the N type well 42c.

A gate electrode 32 is formed on the P type well 44b with the gate insulation film 30b formed therebetween. The N type lightly doped diffused layer is formed in the semiconductor substrate 20 on both sides of the gate electrode 32. The sidewall insulation film 34 is formed on the side wall of the gate electrode 32. The N type heavily doped diffused layer is formed in the semiconductor substrate 20 on both sides of the electrode 32 with the sidewall insulation film 34 formed on. The N type lightly doped diffused layer and the N type heavily doped diffused layer form the source/drain diffused layer 36n of the LDD structure. Thus, the NMOS transistor including the gate electrode 32 and the source/drain diffused layer 36n is formed.

In the region 16P of the digital circuit part 16, where the PMOS transistor is formed, a gate electrode 32 is formed on the N type well 42c with the gate insulation film 30b formed therebetween. The P type lightly doped diffused layer is formed in the semiconductor substrate 20 on both sides of the gate electrode 32. The sidewall insulation film 34 is formed on the side wall of the gate electrode 32. The P type heavily doped diffused layer is formed in the semiconductor substrate 20 on both sides of the gate electrode 32 with the sidewall insulation film 34 formed on. The P type lightly doped diffused layer and the P type heavily doped diffused layer form the source/drain diffused layer 36p of the LDD structure. Thus, the PMOS transistor 38f including the gate electrode 32 and the source/drain diffused layer 36p is formed. The NMOS transistor 38c and the PMOS transistor 38f form the CMOS circuit.

In the region 18N of the I/O circuit part 18, where the NMOS transistor is formed, the N type buried diffused layer 40d is buried in the semiconductor substrate 20. An N type well 42d is formed, surround the region between the surface of the semiconductor substrate 20 and the buried diffused layer 40d. The N type well 42d is formed in the region 18N, where the NMOS transistor is formed and also in the region 18P, where the PMOS transistor is formed. The N type well 42d and the N type buried diffused layer 40d are connected to each other on the side of the buried diffused layer 40d. A P type well 44c is formed in the region surrounded by the N type buried layer 40d and the N type well 42d. The P type well 44c is electrically isolated from the pixel array part 10 by the buried diffused layer 40d and the N type well 42d.

A gate electrode 32 is formed on the P type well 44c with the gate insulation film 30a formed therebetween. The N type lightly diffused layer is formed in the semiconductor substrate 20 on both sides of the gate electrode 32. The sidewall insulation film 34 is formed on the sidewall of the gate electrode 32. The N type heavily doped diffused layer is formed in the semiconductor substrate 20 on both sides of the gate electrode 32 with the sidewall insulation film 34 formed on. The N type lightly doped diffused layer and the N type heavily doped diffused layer form the source/drain diffused layer 36n of the LDD structure. Thus, the NMOS transistor 38g including the gate electrode 32 and he source/drain diffused layer 36n is formed.

In the region 18P of the I/O circuit 18, where the PMOS transistor is formed, a gate electrode 32 is formed on the N type well 42d with the gate insulation film 30a formed therebetween. The sidewall insulation film 34 is formed on the side wall of the gate electrode 32, The P type source/drain diffused layer 36p is formed in the semiconductor substrate 20 on both sides of the gate electrode 32 with the sidewall insulation film 34 formed on. Thus, the PMOS transistor 38h including the gate electrode 32 and the source/drain diffused layer 36p is formed. The NMOS transistor 38g and the PMOS transistor 38h form the CMOS circuit.

On the source/drain diffused layer 36n, 36p, source/drain electrodes 46a of metal silicide are formed. Also on the upper surfaces of the gate electrodes 32, a metal silicide film 46b is formed.

An inter-layer insulation film 48 is formed on the semiconductor substrate 20 with the photodiodes PD1, PD2, the NMOS transistors 38a–38c, 38e, 38g, the PMOS transistors 38d, 38f, 38h, etc. formed on.

In the inter-layer insulation film 48, contact holes 50a and contact holes 50b are formed respectively down to the source/drain electrodes 46a and down to the gate electrodes 32.

Conductor plugs 52 are buried in the contact holes 50a, 50b.

On the inter-layer insulation film 48 with the conductor plugs 52 buried in, interconnections 54 are formed, connected to the conductor plugs 52.

On the inter-layer insulation film 48 with the interconnections 54 formed on, other interconnection layers and other inter-layer insulation layers 56 are formed respectively in plural layers.

A shield film 58 is formed on the inter-layer insulation film 56. In the shield film 58, an opening 60 is formed in for opening the region 10D of the pixel array part 10, where the photodiode is formed. The photodiode PD2 of the black pixel array part 12 is shielded from light by the shield film 58.

As described above, in the present embodiment, the so-called triple well structure is used in the black pixel array part 12, the analog circuit part 14, the digital circuit part 16 and the I/O circuit 18. That is, in the present embodiment, the P type well 28b of the black pixel array part 12 is electrically isolated from the pixel array part 10 by the N type well 42a and the N type buried diffused layer 40a, the P type well 44a of the analog circuit 14 is electrically isolated from the pixel array part 10 by the N type well 42b and the N type buried diffused layer 40b, the P type well 44b of the digital circuit 16 is electrically isolated from the pixel array part 10 by the N type well 42c and the N type buried diffused layer 40c, and the P type well 44c of the I/O circuit part 18 is electrically isolated from the pixel array part 10 by the N type well 42d and the N type well 40d.

The P type well 28b of the black pixel array part 12 is electrically isolated from the pixel array part 10 by the N type well 42a and the N type buried diffused layer 40a, so that when relatively intense light is incident on the pixel array part 10, the inflow of charges into the black pixel array 12 is prevented to thereby obtain stable reference signals.

The P type well 44a of the analog circuit part 14 is electrically isolated from the pixel array part 10 by the N type well 42b and the N type buried diffused layer 40b, so that the intrusion of noises into the analog circuit part 14 is prevented, and also the noises generated in the analog circuit part 14 are prevented from affecting the other components.

The P type well 44b of the digital circuit part 16 is electrically isolated from the pixel array part 10 by the N type well 42c and the N type buried diffused layer 40c, so that the intrusion of noises into the digital circuit part 16 is prevented, and also the noises generated in the digital circuit part 16 are prevented from affecting the other components.

The P type well 44c of the I/O circuit 18 is electrically isolated from the pixel array part 10 by the N type well 42d and the N type buried diffused layer 40d, so that the intrusion of noises into the I/O circuit part 18 is prevented, and also the noises intruding into the I/O circuit part 18 from the outside and the noises generated in the I/O circuit part 18 are prevented from affecting the other components.

The so-called triple structure is not used in the pixel array part 10 for the following reason.

That is, for the highly efficient photoelectric conversion in the photodiode PD1, it is important that when light is incident on the photodiode PD1 from the outside, the depletion layer is extended to sufficiently deep region of the semiconductor substrate 20. If the N type impurity diffused region 24a forming the photodiode PD1 is formed in the P type well, because of the higher impurity concentration of the P type well than that of the semiconductor substrate 20, the depletion layer cannot easily extend when light is incident on the photodiode PD1. Even if the impurity concentration of the P type well is set lower so as to make it easy for the depletion layer to extend, depletion layer is hindered from extending by the N type buried diffused layer formed below the P type well. Accordingly, the use of the triple well structure in the pixel array part 10 makes it very difficult to realize high quality image.

For this reason, the triple structure is not used in the pixel array part 10 but used in the black pixel array part 12, the analog circuit part 14, the digital circuit part 16 and the I/O circuit 18, whereby the pixel array part 10 is kept from being affected by the noises.

The solid-state image sensor according to the present embodiment is characterized mainly in that the triple well structure is not used in the pixel array part 10 but is used in the black pixel array part 12, the analog circuit part 14, the digital circuit part 16 and the I/O circuit part 18.

In the present embodiment, the triple structure is used in the black pixel part 12, the analog circuit part 14, the digital circuit part 16 and the I/O circuit part 18, whereby the pixel array part 10 is kept form being affected by noises. Furthermore, the pixel array part 10, which does not use the triple well structure, can perform highly efficient photoelectric conversion. Accordingly, the solid-state image sensor according to the present embodiment can realize high quality image quality.

Patent Reference 1 discloses a technique of stabilize the black level by preventing the inflow of charges into the black pixel array part when intense light is incident on the pixels of the pixel array parts. However, it is difficult to realize the drastic improvement of the image quality only by stabilizing the black level. Patent Reference 1 neither discloses nor suggests the technique of the present invention that the triple well structure is used in the analog circuit part, the digital circuit part and the input/output circuit part to thereby realize the drastic improvement of the image quality.

(The Method for Fabricating the Solid-State Image Sensor)

Next, the method for fabricating the solid-state image sensor according to the present embodiment will be explained with reference to FIGS. 3 to 20. FIGS. 3 to 20 are sectional views of the solid-state image sensor according to the present embodiment in the steps of the method for fabricating the solid-state image sensor, which illustrate the method.

Figure 3:
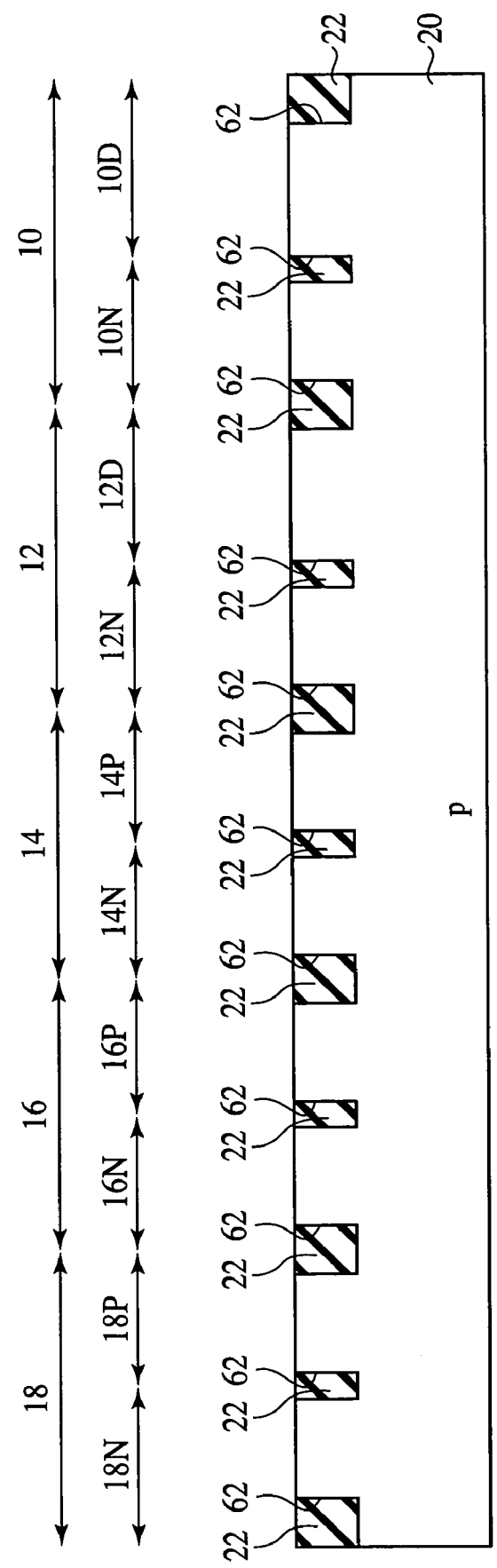
FIG. 3 is a sectional view of the solid-state image sensor according to the first embodiment of the present invention, in the steps of the method for fabricating the solid-state image sensor, which illustrates the method (Part 1).

First, as illustrated in FIG. 3, the P type semiconductor substrate 20 is prepared. The semiconductor substrate 20 is, e.g., an epitaxial substrate with, e.g., a 11 μm-thickness silicon layer epitaxially grown on a silicon substrate. The resistivity of the semiconductor substrate 10 is, e.g., 10 Ω·cm.

Next, trenches 62 of an about 250 nm-depth are formed in the semiconductor substrate 20. Then, a silicon oxide film is formed on the entire surface. Then, the silicon oxide film is polished by, e.g., CMP until the surface of the semiconductor substrate 20 is exposed. The silicon oxide film is thus buried in the trenches 62 to form the device isolation regions 22. Thus, the device isolation regions 22 are formed by STI (Shallow Trench Isolation).

Figure 4:
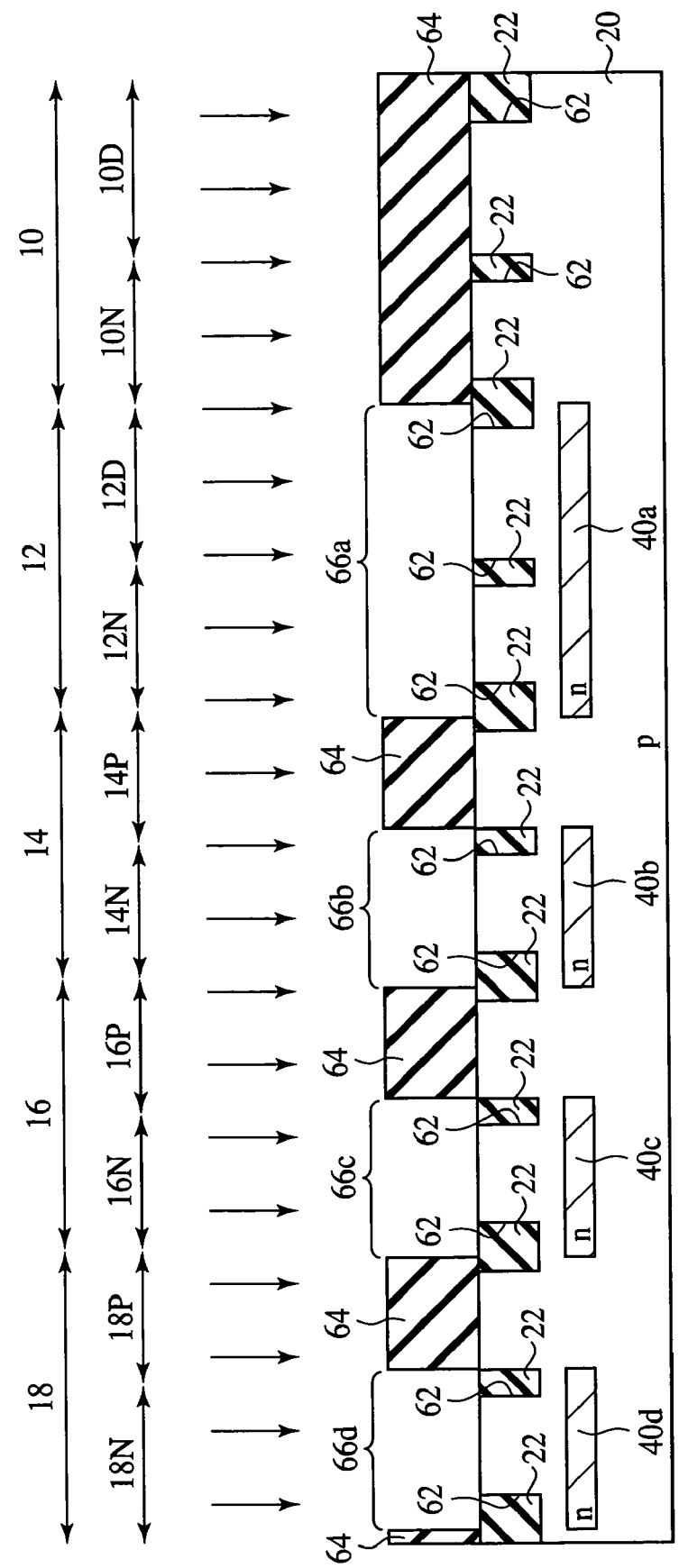
FIG. 4 is a sectional view of the solid-state image sensor according to the first embodiment of the present invention, in the steps of the method for fabricating the solid-state image sensor, which illustrates the method (Part 2).

Next, as illustrated in FIG. 4, a photoresist film 64 is formed on the entire surface by spin coating.

Then, the photoresist film 64 is patterned by photolithography. Thus, in the photoresist film 64, an opening 66a is formed to expose the black pixel array part 12, an opening 66b is formed to expose the region 14N of the analog circuit part 14, where the NMOS transistor is to be formed, an opening 66c is formed to expose the region 16N of the digital circuit part 16, where the NMOS transistor is to be formed, and an opening 66d is formed to expose the region 18N of the I/O circuit part 18, where the NMOS transistor is to be formed.

Next, with the photoresist film 64 as the mask, an N type dopant impurity is implanted by ion implantation. The N type dopant impurity is, e.g., phosphorus ($P^+$). Conditions for the ion implantations are, e.g., a 1 MeV acceleration energy and a $1\times10^{13}$–$5\times10^{13}$ cm$^{-2}$. Thus, the N type buried diffused layer 40a–40d is buried. The buried diffused layer 40a–40d is buried in the region which is about 1–1.5 μm deep from the surface of the semiconductor substrate 20. Then, the photoresist film 64 is released.

Figure 5:
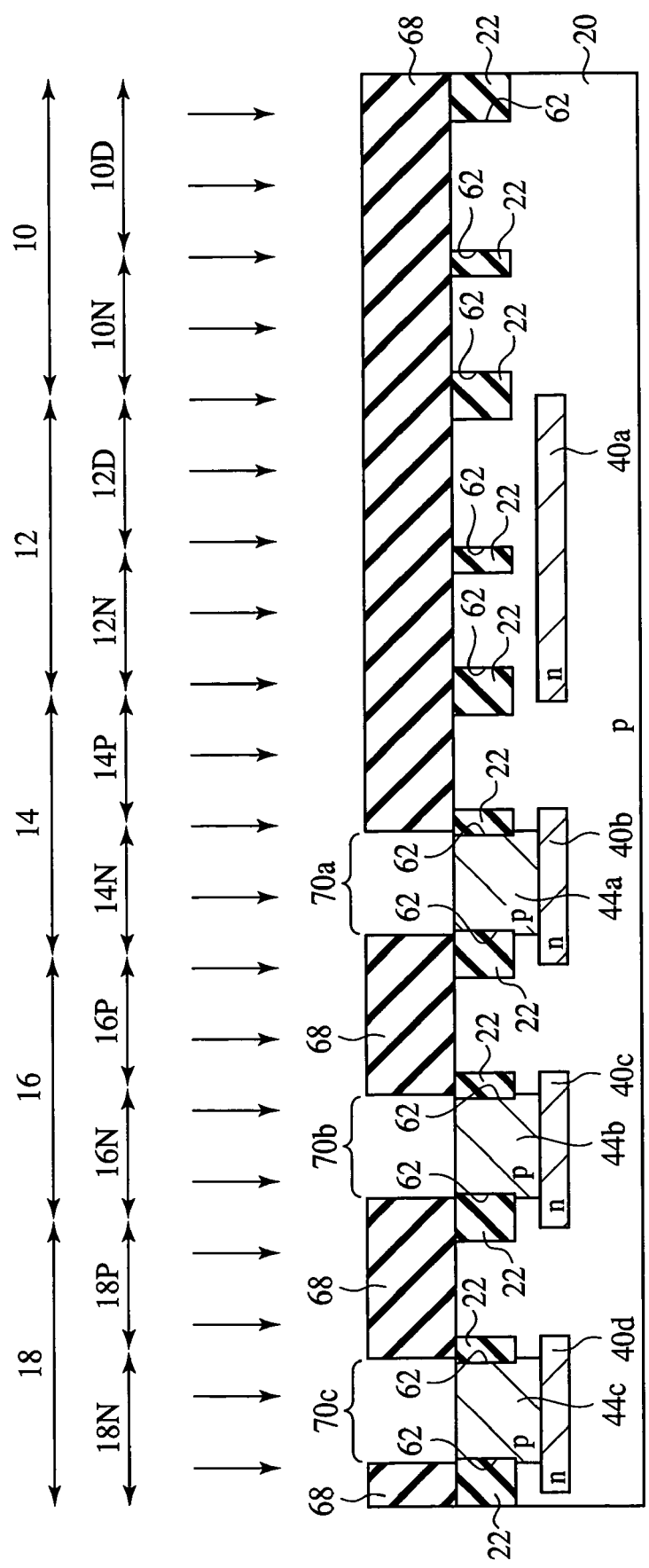
FIG. 5 is a sectional view of the solid-state image sensor according to the first embodiment of the present invention, in the steps of the method for fabricating the solid-state image sensor, which illustrates the method (Part 3).

Next, as illustrated in FIG. 5, a photoresist film 68 is formed on the entire surface by spin coating.

Next, the photoresist film 68 is patterned by photolithography. Thus, an opening 70a for exposing the region 14N of the analog circuit part 14, where the NMOS transistor is to be formed, an opening 70b for exposing the region 16N of the digital circuit part 16, where the NMOS transistor is to be formed, and an opening 70c for exposing the region 18N of the I/O circuit part 18, where the NMOS transistor is to be formed are formed in the photoresist film 68.

Then, with the photoresist film 68 as the mask, a P type dopant impurity is introduced by ion implantation. The P type dopant impurity is, e.g., boron ($B^+$). Conditions for the ion implantation are, e.g., a 300–500 keV and a $1\times10^{13}$–$5\times10^{13}$ cm$^{-2}$. Thus, the P type wells 44a–44c are formed.

A threshold voltage control layer (not illustrated) for controlling threshold voltages of the NMOS transistors 38c, 38e, 38g (see FIG. 2) may be formed by implanting a dopant impurity in the semiconductor substrate 20 with the photoresist film 58 as a mask, before the photoresist film 68 is released. In forming the threshold voltage control layer, a P type dopant impurity is introduced in a relative shallow region of the semiconductor substrate 20 by ion implantation with the photoresist film 68 as the mask. The P type dopant impurity is, e.g., boron. Conditions for the ion implantation are, e.g., an acceleration energy of 50 keV or below, and a $1\times10^{12}$–$7\times10^{12}$ cm$^{-2}$ dose. Then, the photoresist film 68 is released.

Figure 6:
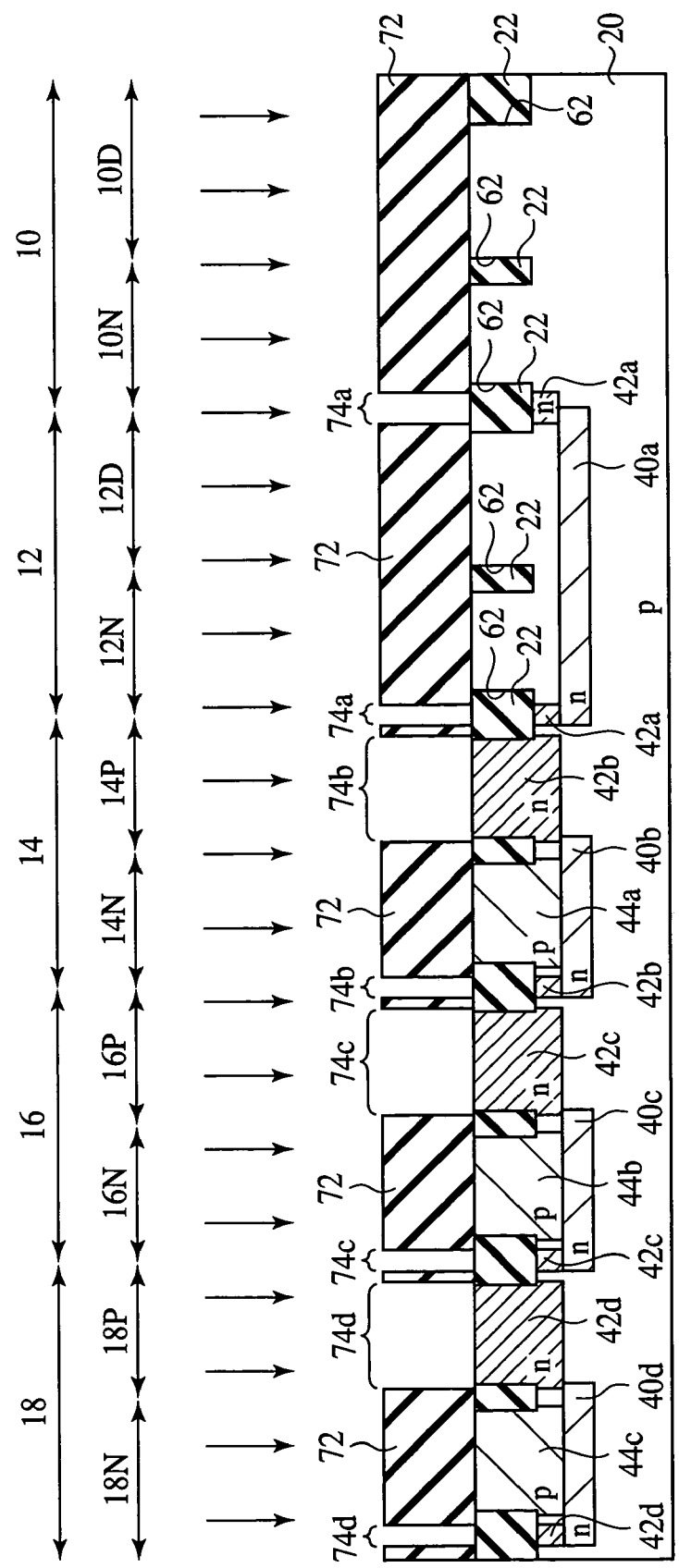
FIG. 6 is a sectional view of the solid-state image sensor according to the first embodiment of the present invention, in the steps of the method for fabricating the solid-state image sensor, which illustrates the method (Part 4).

Then, as illustrated in FIG. 6, a photoresist film 72 is formed on the entire surface by spin coating.

Next, the photoresist film 72 is patterned by photolithography. Thus, in the photoresist film 72, openings 74a–74d for exposing the peripheral edges of the region where the buried diffused layers 40a–40d are formed. The opening 74b for exposing the peripheral edge of the region where the buried diffused layer 40b is formed is formed, exposing also the peripheral edge of the region 14P of the analog circuit part 14, where the PMOS transistor is to be formed. The opening 74c for exposing the peripheral edge of the region where the buried diffused layer 40c is formed is formed, exposing also the region 16P of the digital circuit part 16, where the PMOS transistor is to be formed. The opening 74d for exposing the peripheral edge of the region where the buried diffused layer 40d is formed is formed, exposing also the region 18P of the I/O circuit 18, where the PMOS transistor is to be formed.

Next, an N type dopant impurity is introduced by ion implantation with the photoresist film 72 as the mask. The N type dopant impurity is, e.g., phosphorus ($P^+$). Conditions for the ion implantation are, e.g., a 500–700 keV acceleration energy and a $1\times10^{13}$–$5\times10^{13}$ cm$^{-2}$. Thus, the N type wells 42a–42d are formed in the black pixel array part 12, the analog circuit part 14, the digital circuit part 16 and the I/O circuit 18. The N type wells 42a–42d and the N type buried diffused layers 40a–40d are connected each other at the sides of the N type buried diffused layer 40a–40d.

A threshold voltage control layer (not illustrated) for controlling threshold voltages of the PMOS transistors 38d, 38f, 38h (see FIG. 2) may be formed by implanting a dopant impurity in the semiconductor substrate 20 with the photoresist film 72 as a mask, before the photoresist film 72 is released. In forming the threshold voltage control layer, an N type dopant impurity is introduced in a relative shallow region of the semiconductor substrate 20 by ion implantation with the photoresist film 72 as the mask. The N type dopant impurity is, e.g., arsenic ($As^+$). Conditions for the ion implantation are, e.g., an acceleration energy of 200 keV or below, and a $1\times10^{12}$–$5\times10^{12}$ cm$^{-2}$ dose. Then, the photoresist film 72 is released.

Figure 7:
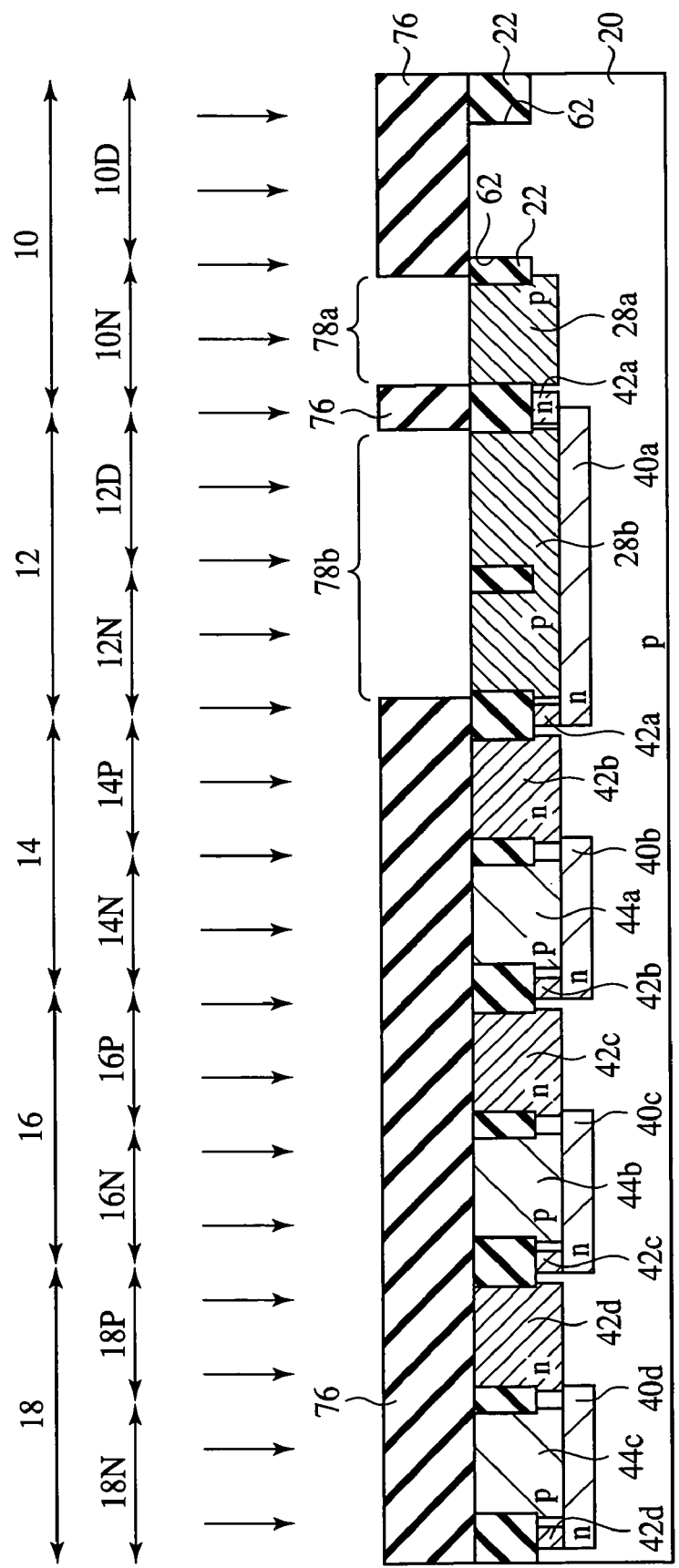
FIG. 7 is a sectional view of the solid-state image sensor according to the first embodiment of the present invention, in the steps of the method for fabricating the solid-state image sensor, which illustrates the method (Part 5).

Then, as illustrated in FIG. 7, a photoresist film 76 is formed on the entire surface by spin coating.

Then, the photoresist film 76 is patterned by photolithography. An opening 78a for exposing the region 10N of the pixel array part 10, where the NMOS transistor is to be formed, and an opening 78b for exposing the black pixel array part 14 is formed.

Next, a P type dopant impurity is introduced by ion implantation with the photoresist film 76 as the mask, The P type dopant impurity is, e.g., boron. Conditions for the ion implantation are, e.g., a 300–500 keV acceleration energy and a $1\times10^{13}$–$5\times10^{13}$ cm$^{-2}$. Thus, the P type well 28a is formed in the region 10N of the pixel array part 10, where the NMOS transistor is to be formed. The P type well 28b is formed in the region of the black pixel array part 12, which is surrounded by the N type well 42a and the buried diffused layer 28b.

A threshold voltage control layer (not illustrated) for controlling threshold voltages of the NMOS transistors 38a, 38b (see FIG. 2) may be formed by implanting a dopant impurity in the semiconductor substrate 20 with the photoresist film 76 as a mask, before the photoresist film 76 is released. In forming the threshold voltage control layer, a P type dopant impurity is introduced in a relative shallow region of the semiconductor substrate 20 by ion implantation with the photoresist film 76 as the mask. The P type dopant impurity is, e.g., boron. Conditions for the ion implantation are, e.g., a 50 keV acceleration energy and a $2\times10^{12}$–$7\times10^{12}$ cm$^{-2}$ dose. Then, the photoresist film 76 is released.

Figure 8:
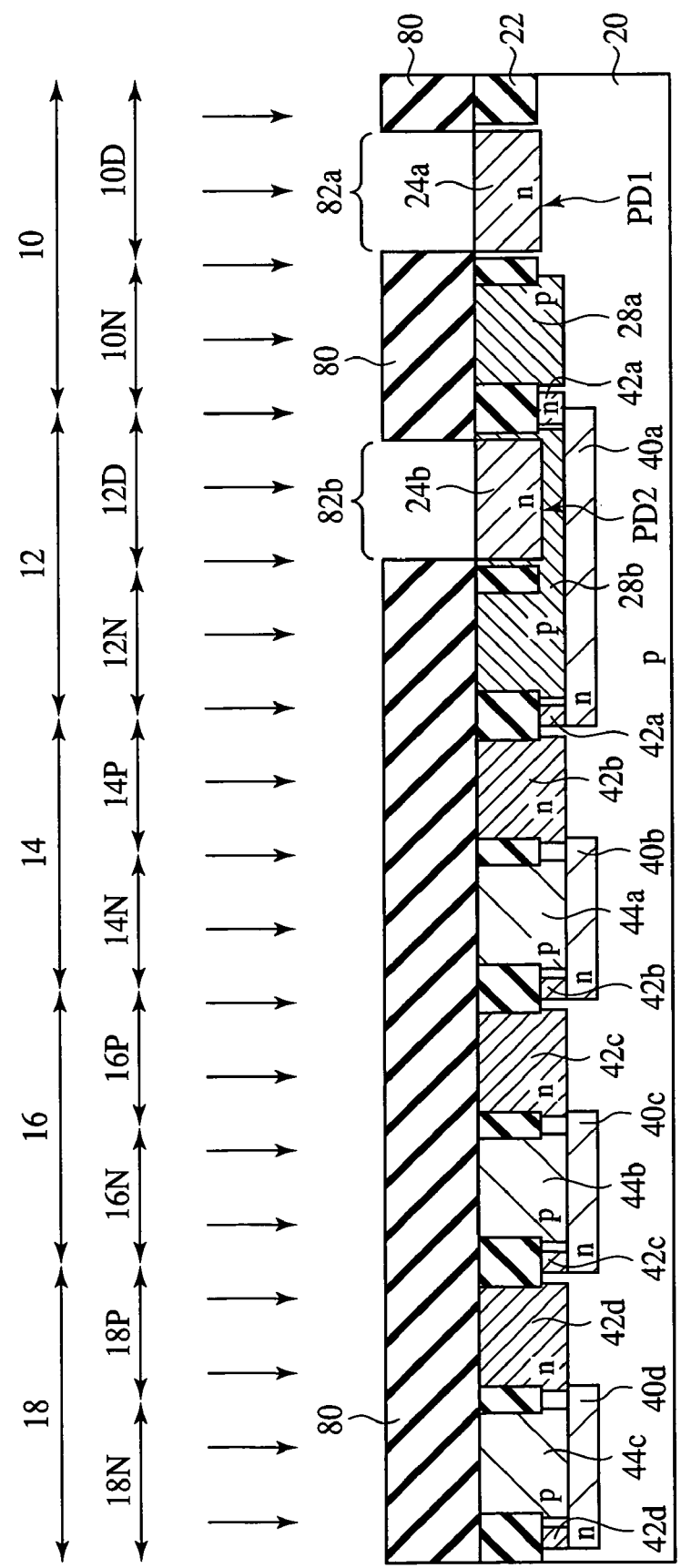
FIG. 8 is a sectional view of the solid-state image sensor according to the first embodiment of the present invention, in the steps of the method for fabricating the solid-state image sensor, which illustrates the method (Part 6).

Then, as illustrated in FIG. 8, a photoresist film 80 is formed on the entire surface by spin coating.

Next, the photoresist film 80 is patterned by photolithography to form in the photoresist film 80 an opening 82a for exposing the region of the pixel array part 10, where the photodiode PD1 is to be formed, and an opening 82b of the black pixel array part 12, where the photodiode PD2 is to be formed.

Next, an N type dopant impurity is introduced by ion implantation with the photoresist film 80 as the mask. The dopant impurity is, e.g., phosphorus. Conditions for the ion implantation are, e.g., a 300–500 keV acceleration energy and a $1\times10^{12}$–$5\times10^{12}$ cm$^{-2}$. Thus, the N type impurity diffused regions 24a, 24b forming the photodiode PD1, PD2 are formed.

The ion implantation may be repeated by plural times to form the N type impurity diffused region 24a, 24b. In this case, conditions for the first ion implantation are, e.g., a 300–500 keV acceleration energy and a $1\times10^{12}$–$5\times10^{12}$ cm$^{-2}$ dose, and the conditions for the second ion implantation are, e.g., an about 100 keV acceleration energy and a $1\times10^{12}$–$5\times10^{12}$ cm$^{-2}$ dose. The N type impurity diffused regions 24a, 24b may be thus formed. Then, the photoresist film 80 is released.

Figure 9:
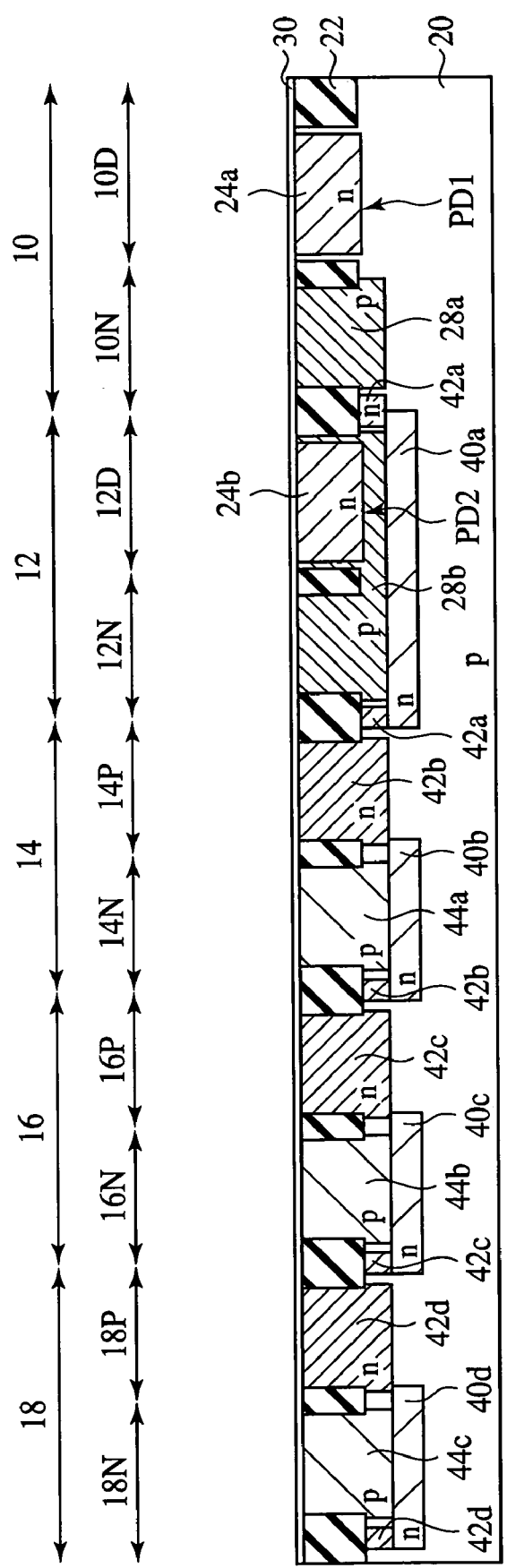
FIG. 9 is a sectional view of the solid-state image sensor according to the first embodiment of the present invention, in the steps of the method for fabricating the solid-state image sensor, which illustrates the method (Part 7).

Next, as illustrated in FIG. 9, the gate insulation film 30 of, e.g., a 5–8 nm-thickness is formed on the entire surface.

Figure 10:
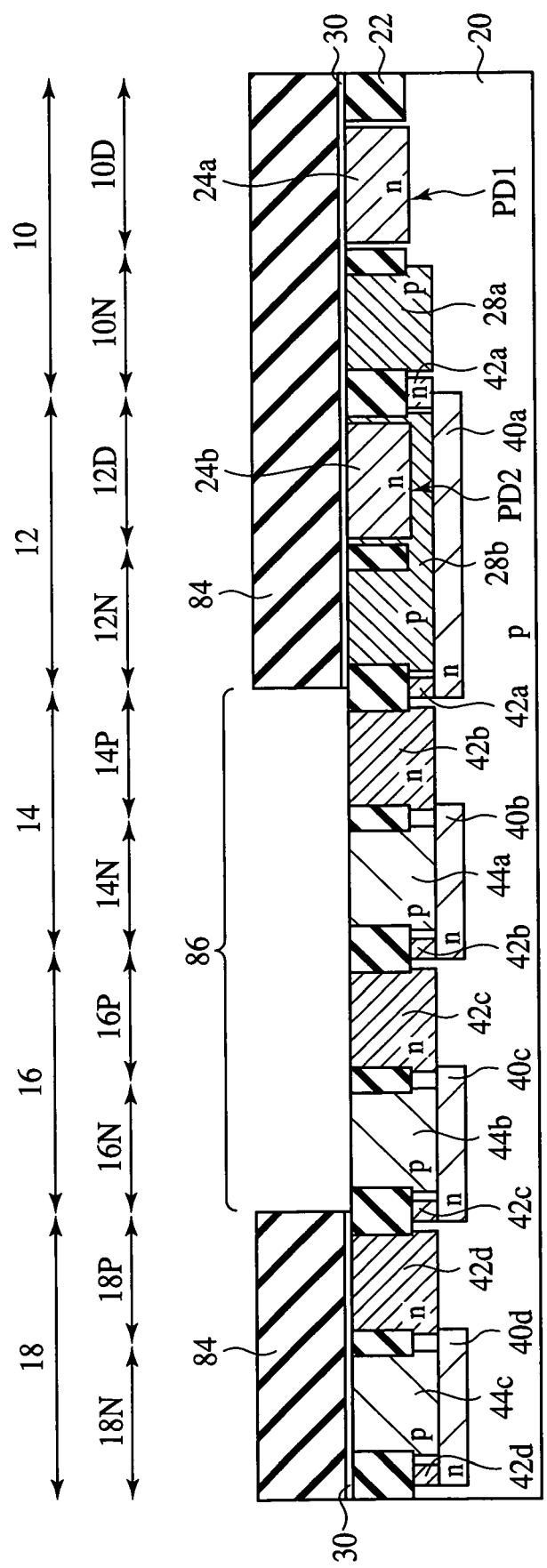
FIG. 10 is a sectional view of the solid-state image sensor according to the first embodiment of the present invention, in the steps of the method for fabricating the solid-state image sensor, which illustrates the method (Part 8).

Next, as illustrated in FIG. 10, a photoresist film 84 is formed on the entire surface by spin coating.

Then, an opening 86 for exposing the region 14, where the analog circuit part is to be formed and the region 16, where the digital circuit part is to be formed is formed in the photoresist film 84 by photolithography.

Next, with the photoresist film 84 as the mask, the gate insulation film 30 exposed in the opening 86 is etched off. The etchant is, e.g., hydrofluoric acid. Then, the photoresist film 84 is released.

Next, by thermal oxidation, the gate insulation film 30b is formed on the exposed surface of the semiconductor substrate 20 while adding to the thickness of the gate insulation film 30. The conditions for the thermal oxidation are set so that the thermal oxide film is formed in a 3 nm-thickness on the exposed surface of the semiconductor substrate 20. The gate insulation film 30 b is formed in, e.g., a 3 nm-thickness in the analog circuit part 14 and the digital circuit part 16. In the pixel array part 10, the black pixel array part 12 and the I/O circuit part 18, where the gate insulation film 30 has been formed, the film thickness of the gate insulation film 30a there is, e.g., about 8–10 nm (see FIG. 11).

Figure 12:
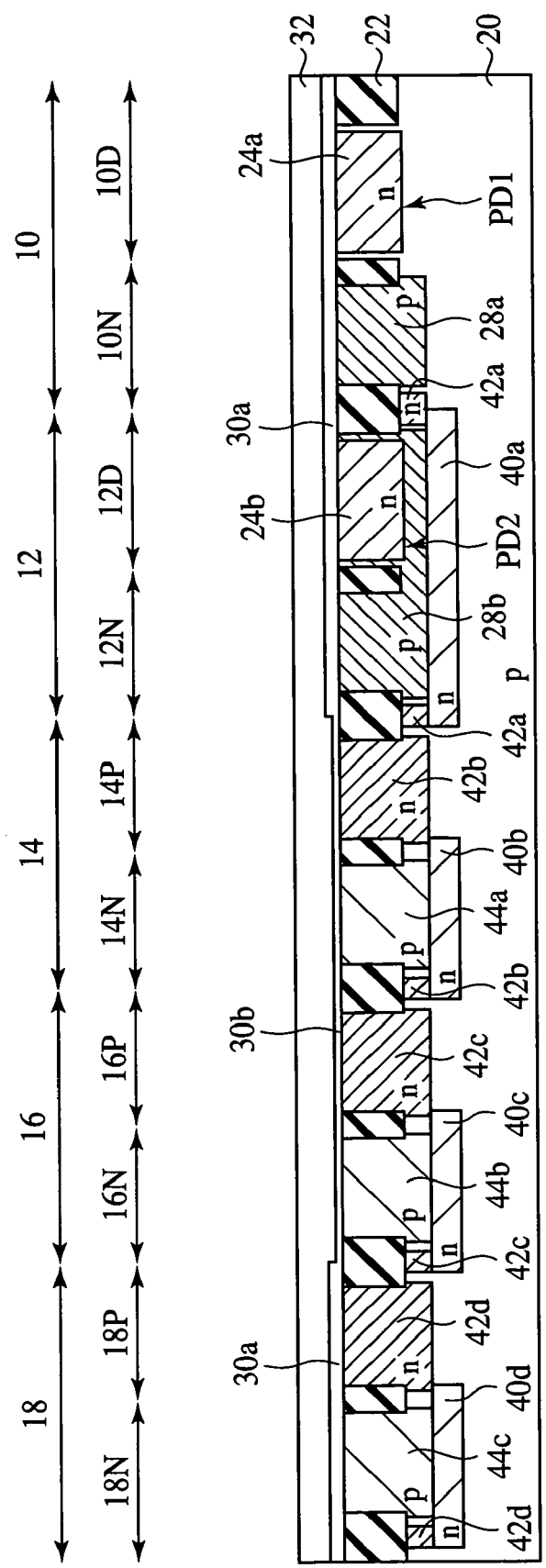
FIG. 12 is a sectional view of the solid-state image sensor according to the first embodiment of the present invention, in the steps of the method for fabricating the solid-state image sensor, which illustrates the method (Part 10).

Next, as illustrated in FIG. 12, a polysilicon film 32 of, e.g., a 150–200 nm-thickness is formed on the entire surface.

Figure 13:
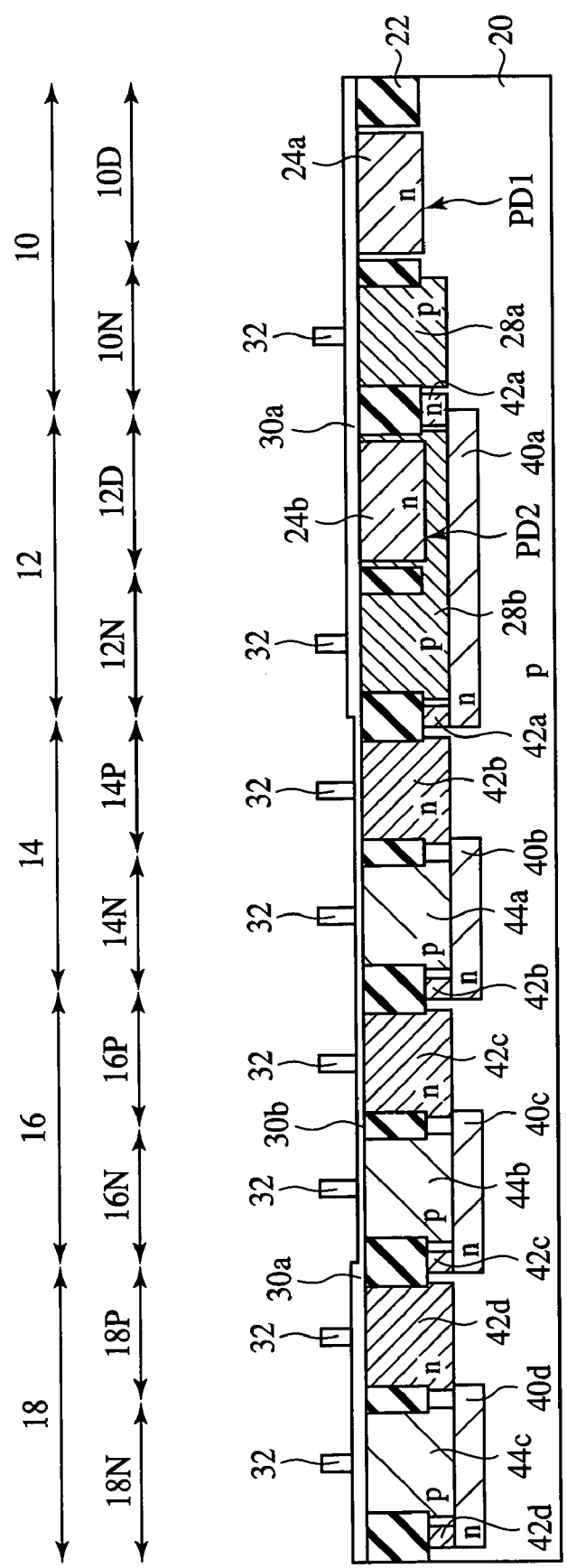
FIG. 13 is a sectional view of the solid-state image sensor according to the first embodiment of the present invention, in the steps of the method for fabricating the solid-state image sensor, which illustrates the method (Part 11).
Figure 14:
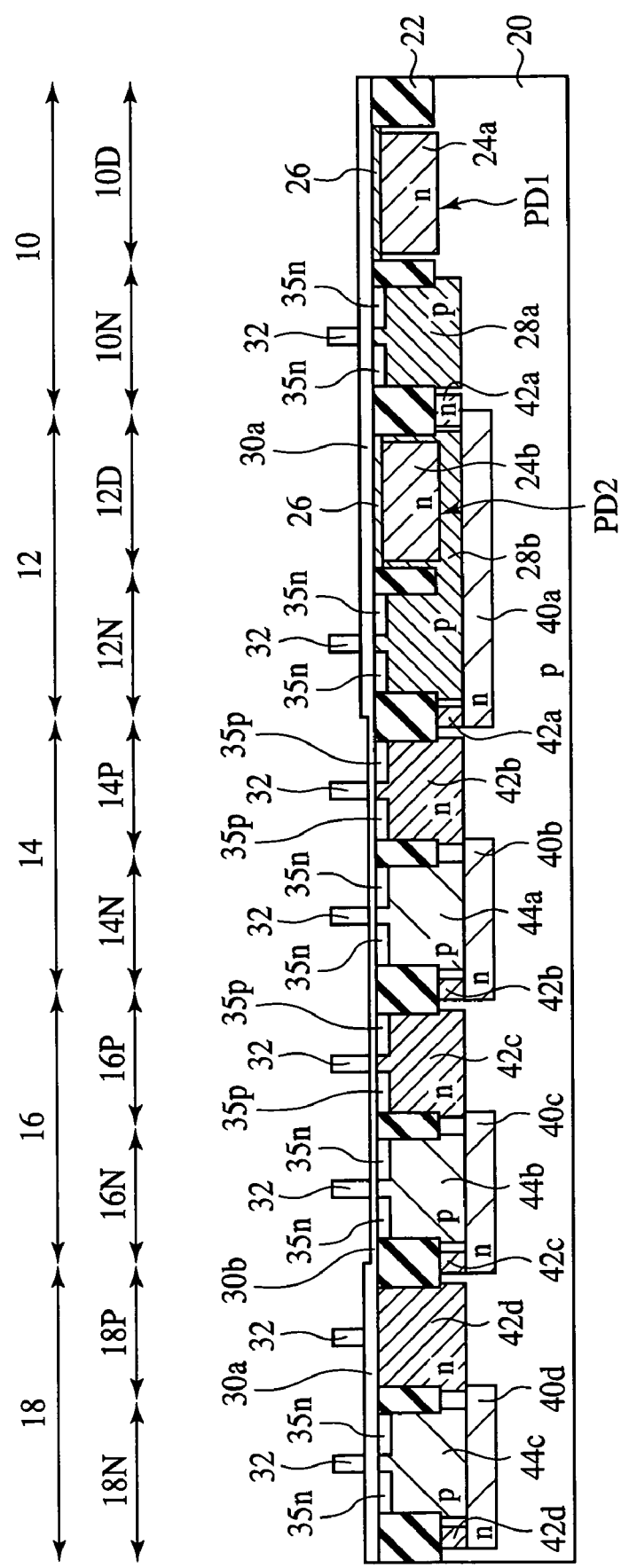
FIG. 14 is a sectional view of the solid-state image sensor according to the first embodiment of the present invention, in the steps of the method for fabricating the solid-state image sensor, which illustrates the method (Part 12).

Next, as illustrated in FIG. 13, the polysilicon film 32 is patterned by photolithography. Thus, the gate electrodes 32 of the polysilicon are formed.

Next, a photoresist film (not illustrated) is formed on the entire surface by spin coating.

Then, openings (not illustrated) for exposing the regions 10N, 12N, 14N, 16N, 18N for the NMOS transistors to be formed are formed in the photoresist film.

Then, with the photoresist film and the gate electrodes 32 as the mask, an N type dopant impurity is introduced into the semiconductor substrate 20 by ion implantation. The dopant impurity is, e.g., arsenic (As$^+$). Conditions for the ion implantation are, e.g., an acceleration energy of 15 keV or below, and a $2\times10^{14}$–$7\times10^{14}$ cm$^{-2}$ dose. Thus, the N type lightly doped diffused layer 35n is formed in the semiconductor substrate 20 on both sides of the gate electrodes 32. Then, the photoresist film is released.

Next, a photoresist film (not illustrated) is formed on the entire surface by spin coating.

Next, openings (not shown) for exposing the regions 14P, 16P, where the PMOS transistors are to be formed, are formed in the photoresist film.

Next, a P type dopant impurity is introduced into the semiconductor substrate 20 by the ion implantation with the photoresist film and the gate electrodes 32 as the mask. The dopant impurity is, e.g., BF$_2^+$. Conditions for the ion implantation are, e.g., an acceleration energy of 15 keV or below, and a $2\times14^{14}$–$7\times10^{14}$ cm$^{-2}$ dose. Thus, the P type lightly doped diffused layer 35p is formed in the semiconductor substrate 20 on both sides of the gate electrodes 32. Then, the photoresist film is released.

Then, a photoresist film (not illustrated) is formed on the entire surface by spin coating.

Next, openings (not illustrated) for exposing the regions 10D, 12D for the photodiodes to be formed in are formed in the photoresist film.

Then, a P type dopant impurity is introduced into the semiconductor substrate 20 by ion implantation with the photoresist film as the mask. The dopant impurity is, e.g., boron (B$^+$). Conditions for the ion implantation are, e.g., a 15 keV acceleration energy and a $1\times10^{13}$–$5\times10^{13}$ cm$^{-2}$ dose. Thus, the P type impurity diffused layer 26 is formed on the surface of the semiconductor substrate 20 in the regions 10D, 12D where the photodiodes are to be formed. Then, the photoresist film is released.

Figure 15:
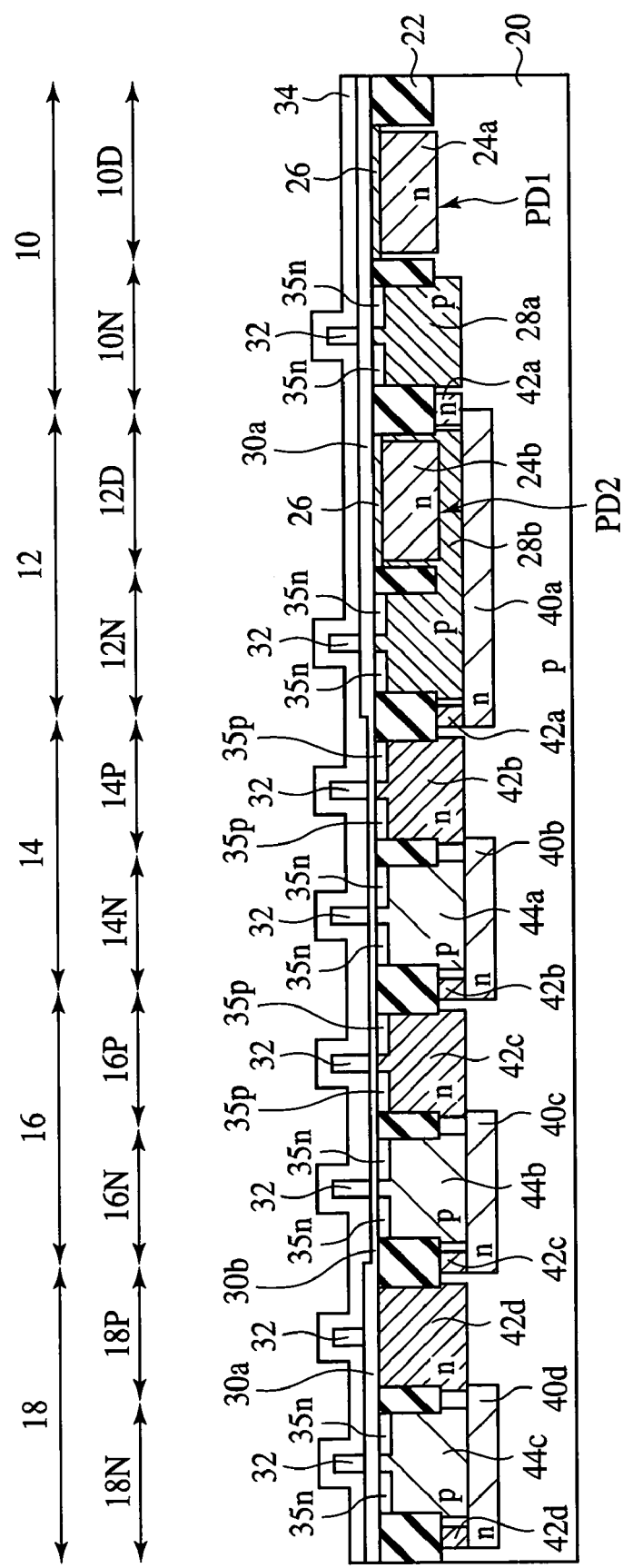
FIG. 15 is a sectional view of the solid-state image sensor according to the first embodiment of the present invention, in the steps of the method for fabricating the solid-state image sensor, which illustrates the method (Part 13).

Next, as illustrated in FIG. 15, the silicon oxide film 34 of a 100 nm-thickness is formed on the entire surface by, e.g., CVD. The silicon oxide film 34 is to be the sidewall insulation film on the side walls of the gate electrodes 32. The silicon oxide film 34 functions also as a protection film for protecting the regions where the metal silicide film 46a, 46b is not to be formed.

Figure 16:
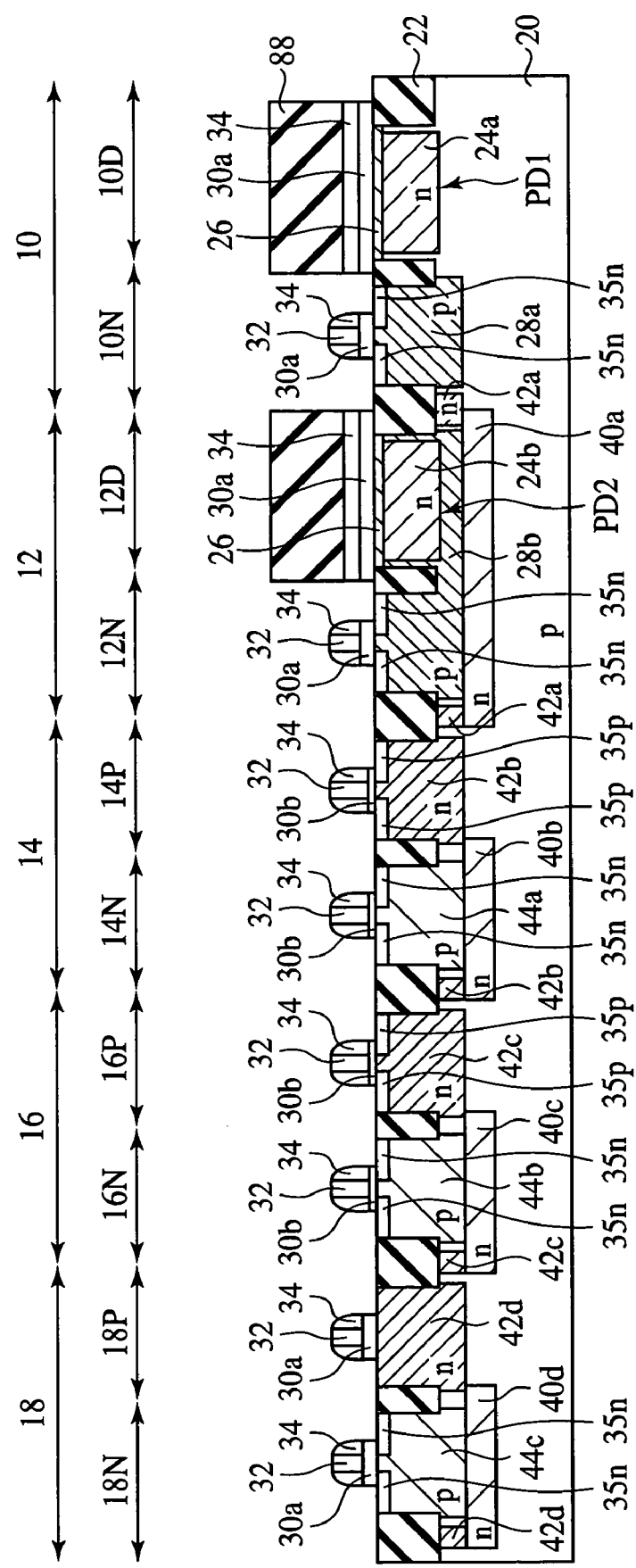
FIG. 16 is a sectional view of the solid-state image sensor according to the first embodiment of the present invention, in the steps of the method for fabricating the solid-state image sensor, which illustrates the method (Part 14).
Figure 17:
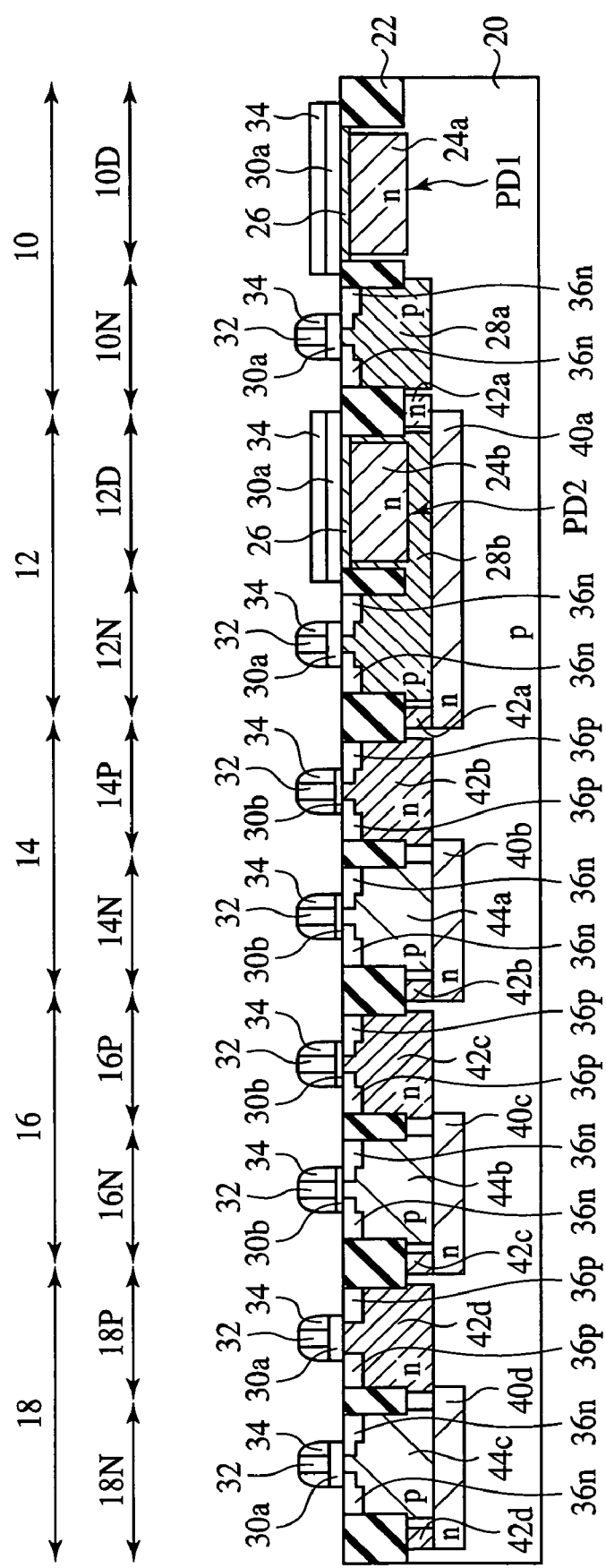
FIG. 17 is a sectional view of the solid-state image sensor according to the first embodiment of the present invention, in the steps of the method for fabricating the solid-state image sensor, which illustrates the method (Part 15).

Next, as illustrated in FIG. 16, a photoresist film 88 is formed on the entire surface by spin coating.

Then, the photoresist film 88 is patterned by photolithography to cover the regions where the metal silicide film 46a, 46b is not to be formed (see FIG. 2).

Next, with the photoresist film 88 as the mask, the silicon oxide film 34 is anisotropically etched. Thus, the sidewall insulation film of the silicon oxide film 34 is formed on the side walls of the gate electrodes 32. The silicon oxide film 34 remains in the regions where the metal silicide film 46a, 46b is not to be formed. Then, the photoresist film 88 is released.

Then, a photoresist film (not illustrated) is formed on the entire surface by spin coating.

Next, a photoresist film for exposing the regions 10N, 12N, 14N, 16N, 18N, where the NMOS transistors are to be formed is formed.

Then, an N type dopant impurity is implanted by ion implantation with the photoresist film and the gate electrodes 32 as the mask. The dopant impurity is, e.g., phosphorus (P$^+$), Conditions for the ion implantation are, e.g., an acceleration energy of 20 keV or below, and a $1\times10^{15}$–$5\times10^{15}$ cm$^{-2}$ dose. Then, the N type heavily doped diffused layer is formed in the semiconductor substrate 20 on both sides of the gate electrodes 32. The N type lightly doped diffused layer 35n and the N-heavily doped diffused layer form the source/drain diffused layer 36n of the LDD structure. Then, the photoresist film is released.

Next, a photoresist film (not illustrated) is formed on the entire surface by spin coating.

Next, openings (not illustrated) for exposing the regions 14P, 16P, 18P, where the PMOS transistors are to be formed, are formed in the photoresist film.

Then, a P type dopant impurity is introduced by ion implantation with the photoresist film and the gate electrodes 32 as the mask. The P type dopant impurity is, e.g., boron (B$^+$). Condition for the ion implantation are, e.g., an acceleration energy of 10 keV or below and a $1\times10^{15}$–$5\times10^{15}$ cm$^{-2}$ dose. Thus, the P type heavily dopes diffused layer is formed in the semiconductor substrate 20 on both sides of the gate electrodes 32. The P type lightly doped diffused layer 35p and the P type heavily dopes diffused layer form the source/drain diffused layer 36p of the LDD structure in the region 14P of the analog circuit part 14, where the PMOS transistor is to be formed and in the region 16P of the digital circuit part 16, where the PMOS transistor is to be formed. In the region 18P of the I/O circuit part 18, where the PMOS transistor is to be formed, the source/drain diffused layer 36p of the P type heavily doped diffused layer is formed. Then, the photoresist film is released (see FIG. 17).

Next, a metal film of a 10 nm-thickness cobalt film is formed by, e.g., puttering.

Next, thermal processing is performed to react the cobalt atoms in the metal film and the silicon atoms in the semiconductor substrate with each other. Thus, the metal silicide film 46a, 46b of cobalt silicide is formed. The atmosphere for the thermal processing is, e.g., nitrogen atmosphere. The temperature for the thermal processing is, e.g., 500° C. The thermal processing period of time is, e.g., 30 seconds. The metal silicide film 46a, which are formed on the surface of the source/drain diffused layer 36p, 36n, functions as the source/drain electrodes. The metal silicide film 46b is formed also on the surfaces of the gate electrodes 32.

The metal film is cobalt film here but is not limited to cobalt film. The metal film may be, e.g., titanium film, and in this case, the metal silicide film is titanium silicide film.

Figure 18:
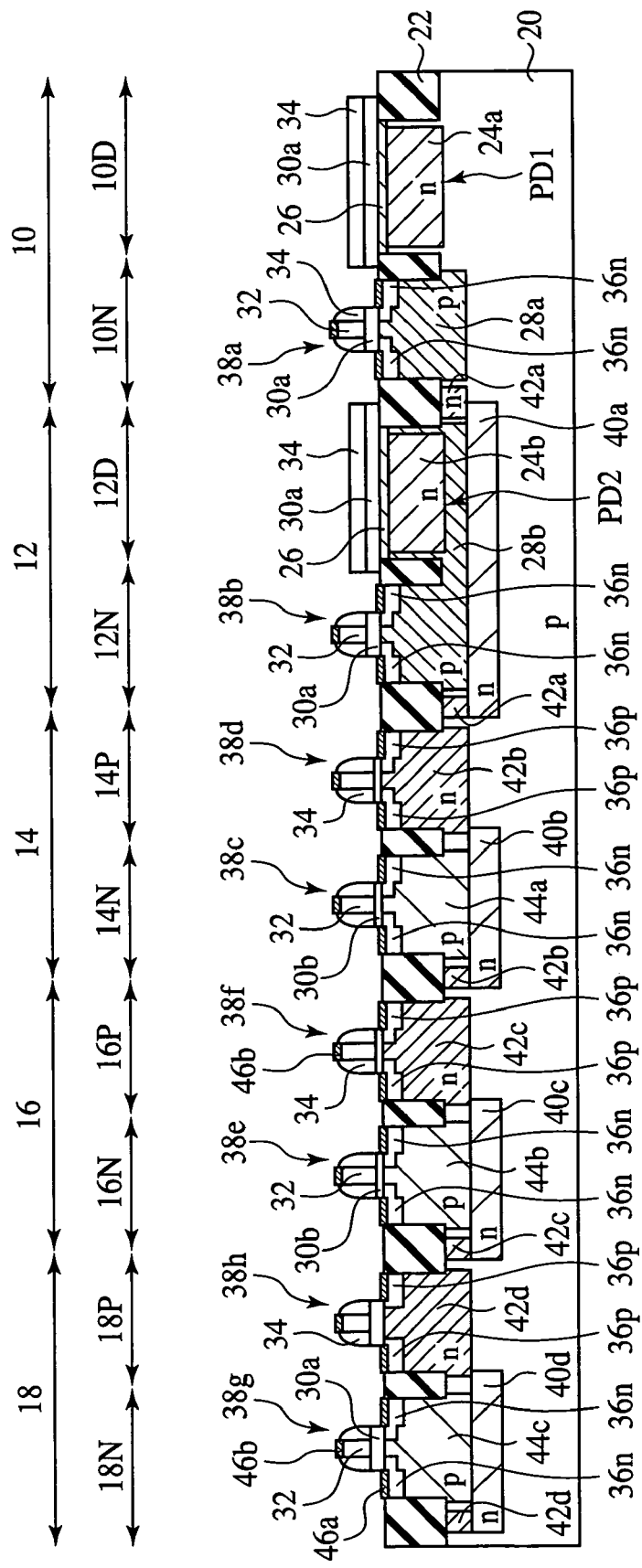
FIG. 18 is a sectional view of the solid-state image sensor according to the first embodiment of the present invention, in the steps of the method for fabricating the solid-state image sensor, which illustrates the method (Part 16).

Next, the metal film which has not reacted is etched off (see FIG. 18).

Figure 19:
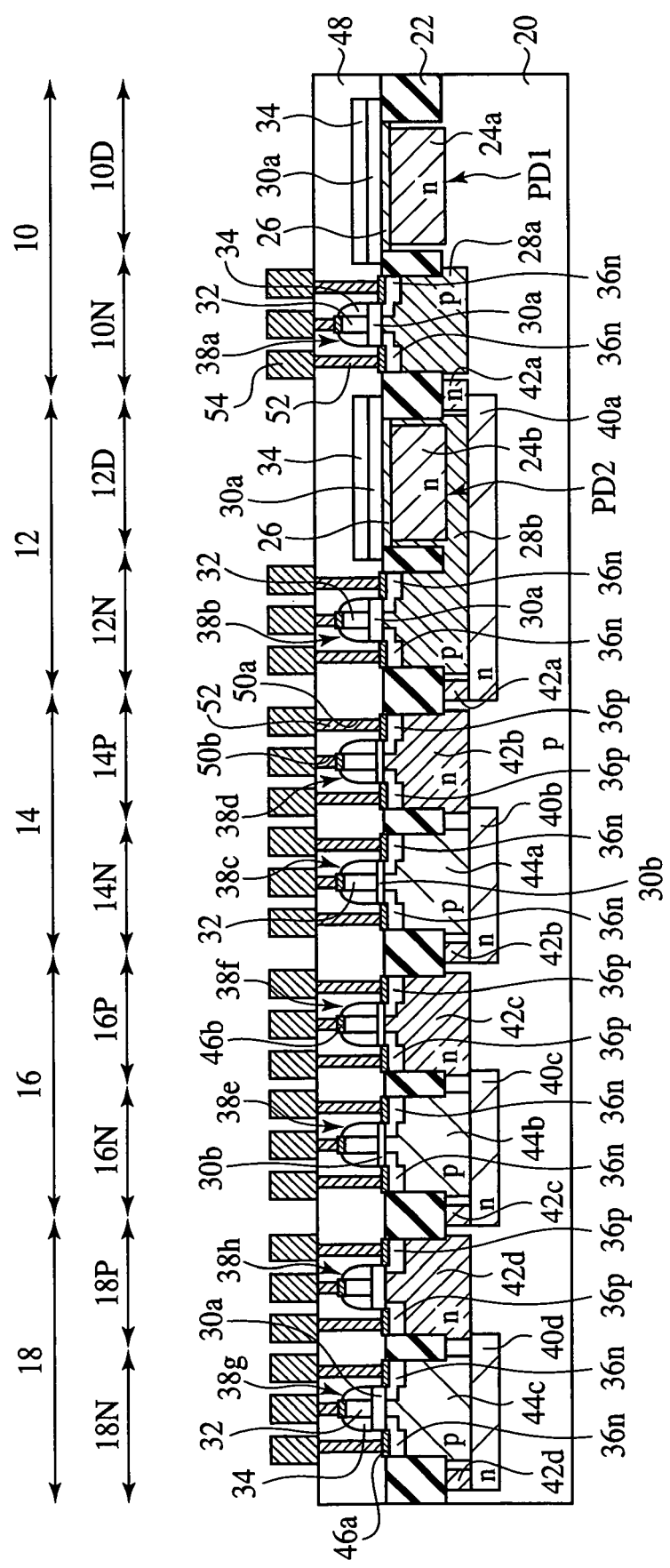
FIG. 19 is a sectional view of the solid-state image sensor according to the first embodiment of the present invention, in the steps of the method for fabricating the solid-state image sensor, which illustrates the method (Part 17).
Figure 20:
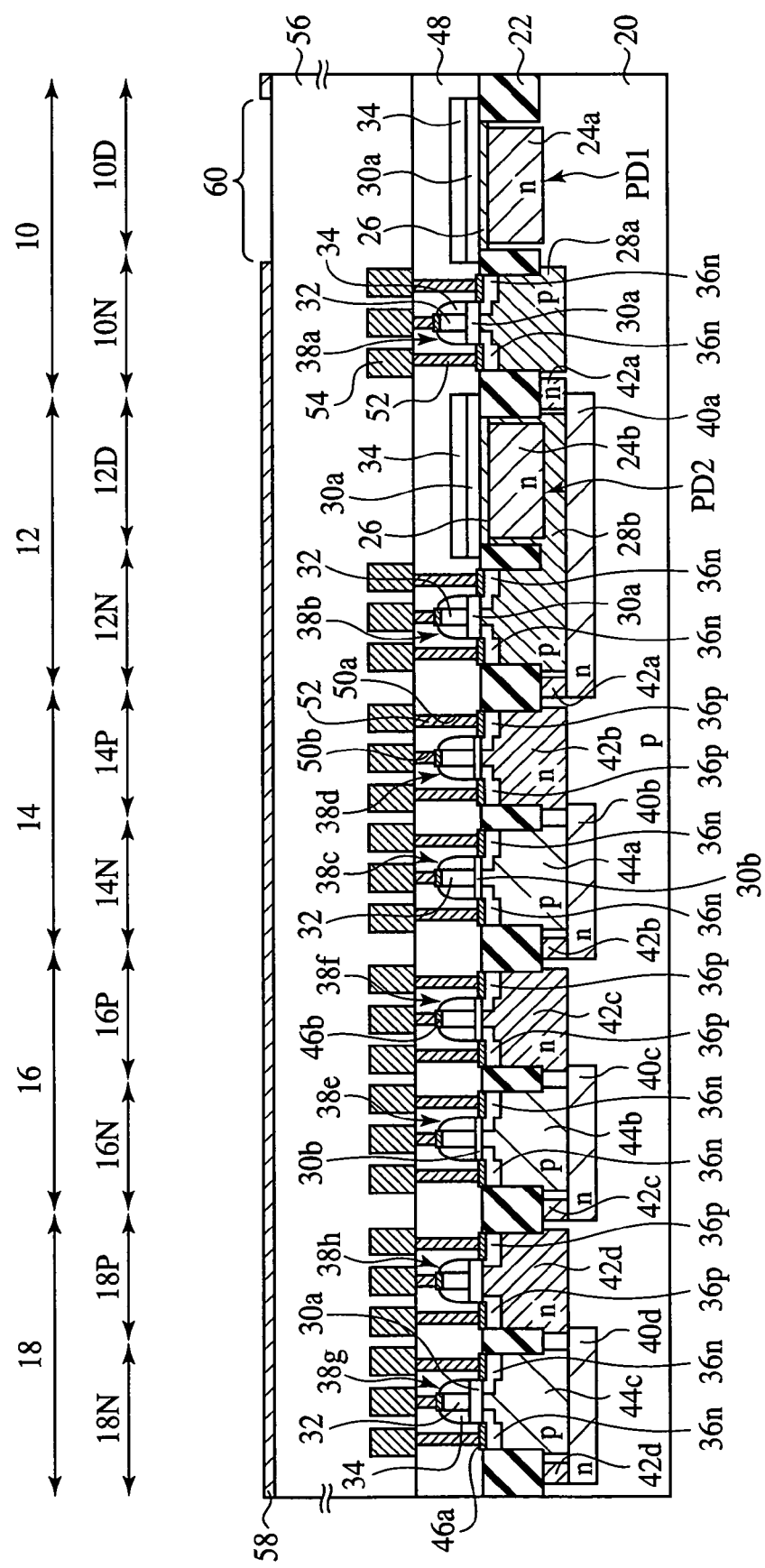
FIG. 20 is a sectional view of the solid-state image sensor according to the first embodiment of the present invention, in the steps of the method for fabricating the solid-state image sensor, which illustrates the method (Part 18).

Next, as illustrated in FIG. 19, the silicon oxide film 48 of a 1500 nm-thickness is formed on the entire surface by, e.g., plasma CVD.

Then, the surface of the silicon oxide film 48 is polished by, e.g., CMP until the film thickness of the silicon oxide film is reduced to about 1000 nm. Thus, the inter-layer insulation film of the silicon oxide film 48 of, e.g., a 1000 nm-thickness is formed.

Next, the contact hole 50a, 50b are formed by photolithography in the inter-layer insulation film 48 respectively down to the source/drain electrode 46a and down to the gate electrode 46b.

Then, a 300 nm-thickness tungsten film is formed on the entire surface by, e.g., CVD.

Then, the tungsten film is polished by, e.g., CMP until the surface of the inter-layer insulation film 48 is exposed. Thus, the conductor plugs 52 of, e.g., tungsten are buried in the contact holes.

Next, a 500 nm-thickness aluminum film 54 is formed by, e.g., sputtering.

Then, the aluminum film 54 is patterned by photolithography. Thus, the interconnections (a first metal interconnection layer) 54 of aluminum are formed.

Then, the step of forming the inter-layer insulation film 56, the step of forming contact holes and the step of forming interconnections are sequentially repeated to thereby form a plurality of interconnection layers 56, the interconnection layers, etc.

Then, the shield film 58 is formed on the inter-layer insulation film 56.

Then, the shield film 58 is patterned by photolithography. Thus, the opening 60 for exposing the region where the photodiode PD1 is formed is formed in the shield film 58.

Thus, the solid-state image sensor according to the present embodiment is fabricated.

(A Modification)

Figure 21:
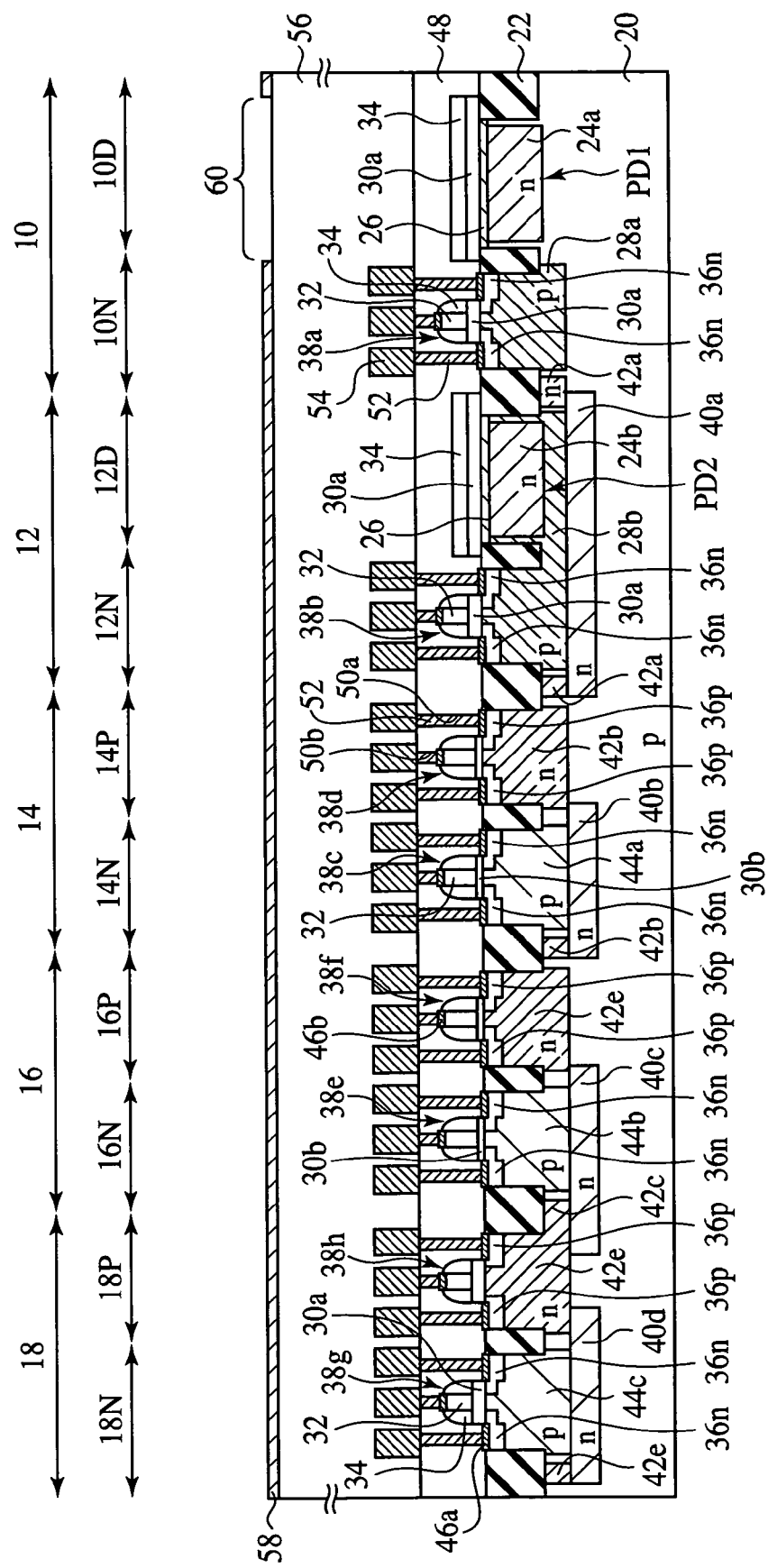
FIG. 21 is a sectional view of the solid-state image sensor according to a modification of the first embodiment of the present invention.

Then, the solid-state image sensor according to a modification of the present embodiment will be explained with reference to FIG. 21. FIG. 21 is a sectional view of the solid-state image sensor according to the present modification.

The solid-state image sensor according to the present modification is characterized mainly in that the N type well 42e of the digital circuit part 16 and the N type well 42e of the I/O circuit part 18 are formed integral with each other, in other words, the N type well 42e of the digital circuit part 16 and the N type well 42e of the I/O circuit part 18 are formed continuous to each other.

The N type buried diffused layer 40c and the N type well 42e are connected to each other at the side of the buried diffused layer 40c.

The N type buried diffused layer 40d and the N type well 42e are connected to each other at the side of the buried diffused layer 40d.

Thus, the N type well 42e of the digital circuit part 16 and the N type well 42e of the I/O circuit part 16 may be formed continuous to each other.

A Second Embodiment

Figure 22:
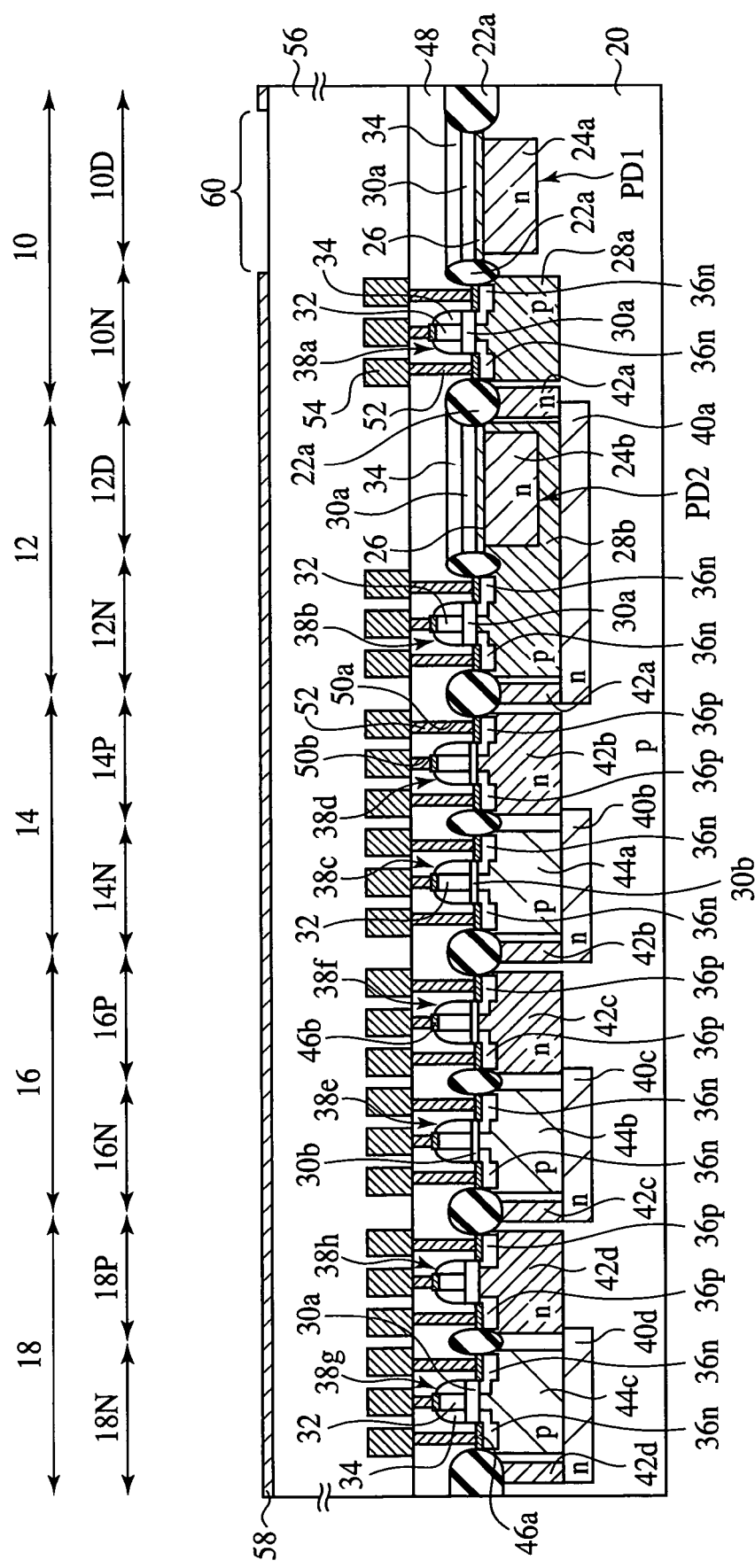
FIG. 22 is a sectional view of the solid-state image sensor according to a second embodiment of the present invention.

The solid-state image sensor according to a second embodiment of the present invention and the method for fabricating the solid-state image sensor will be explained with reference to FIGS. 22 to 26. FIG. 22 is a sectional view of the solid-state image sensor according to the present embodiment. The same members of the present invention as those of the solid-state image sensor according to the first embodiment and the method for fabricating the same illustrated in FIGS. 1 to 21 are represented by the same reference numbers not to repeat or to simplify their explanation.

(The Solid-State Image Sensor)

First, the solid-state image sensor according to the present embodiment will be explained with reference to FIG. 22.

The solid-state image sensor according to the present embodiment is characterized mainly in that device isolation regions 22a are formed by LOCOS (Local oxidation of Silicon).

As illustrated in FIG. 22, in the present embodiment, the device isolation regions 22a are formed by LOCOS. The thickness of the device isolation regions 22a is, e.g., about 300 nm. The device isolation regions 22 are formed down to the depth of about 150 nm from the surface of a semiconductor substrate 20.

Even with the device isolation regions 22a formed by LOCOS, the solid-state image sensor can have improved image quality, as does the solid-state image sensor according to the first embodiment.

(The Method for Fabricating the Solid-State Image Sensor)

Next, the method for fabricating the solid-state image sensor according to the present embodiment will be explained with reference to FIGS. 23 to 26. FIGS. 23 to 26 are sectional views of the solid-state image sensor according to the present embodiment in the steps of the method for fabricating the solid-state image sensor, which illustrate the method.

Figure 23:
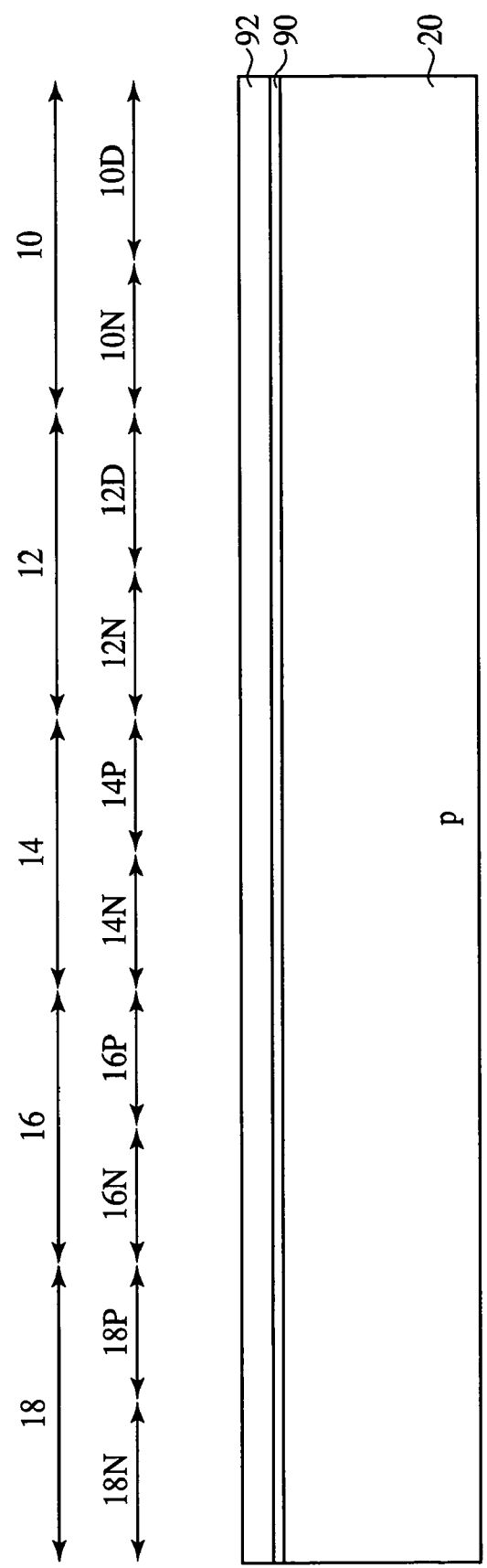
FIG. 23 is a sectional view of the solid-state image sensor according to the second embodiment of the present invention, in the steps of the method for fabricating the solid-state image sensor, which illustrates the method (Part 1).

First, as illustrated in FIG. 23, a 3–10 nm-thickness silicon oxide film 90 is formed on the entire surface by, e.g., thermal oxidation.

Then, a 100–150 nm-thickness silicon nitride film 92 is formed on the entire surface by, e.g., CVD.

Figure 24:
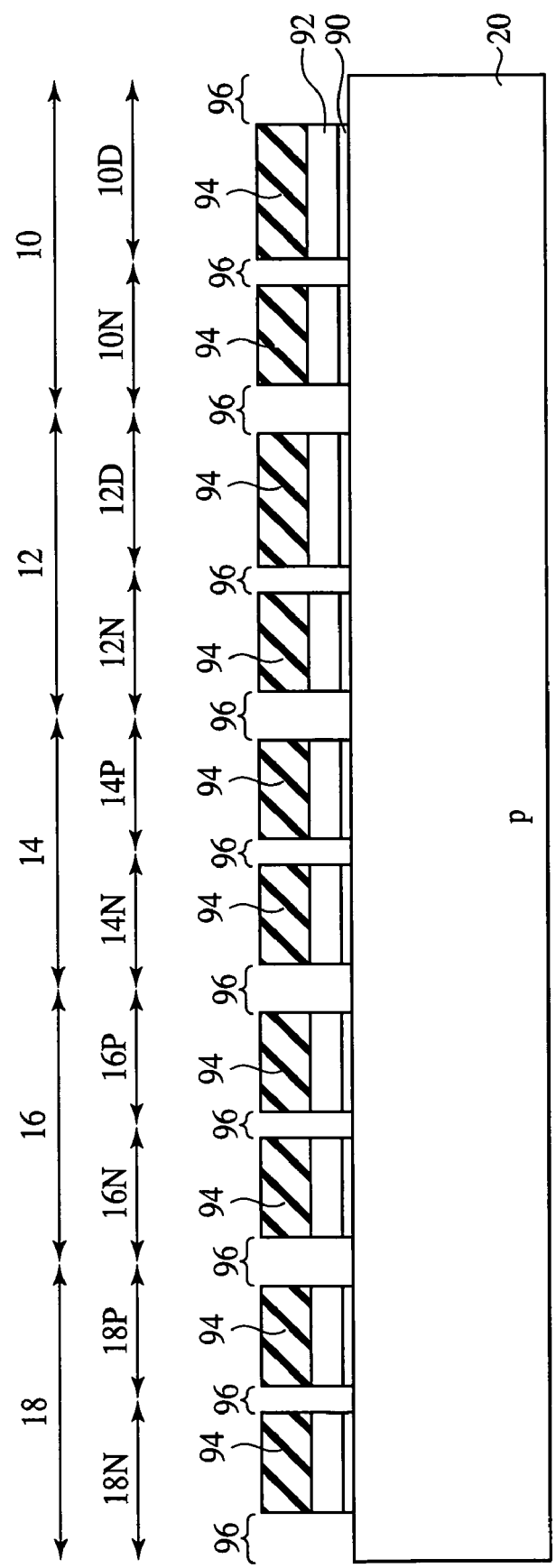
FIG. 24 is a sectional view of the solid-state image sensor according to the second embodiment of the present invention, in the steps of the method for fabricating the solid-state image sensor, which illustrates the method (Part 2).
Figure 25:
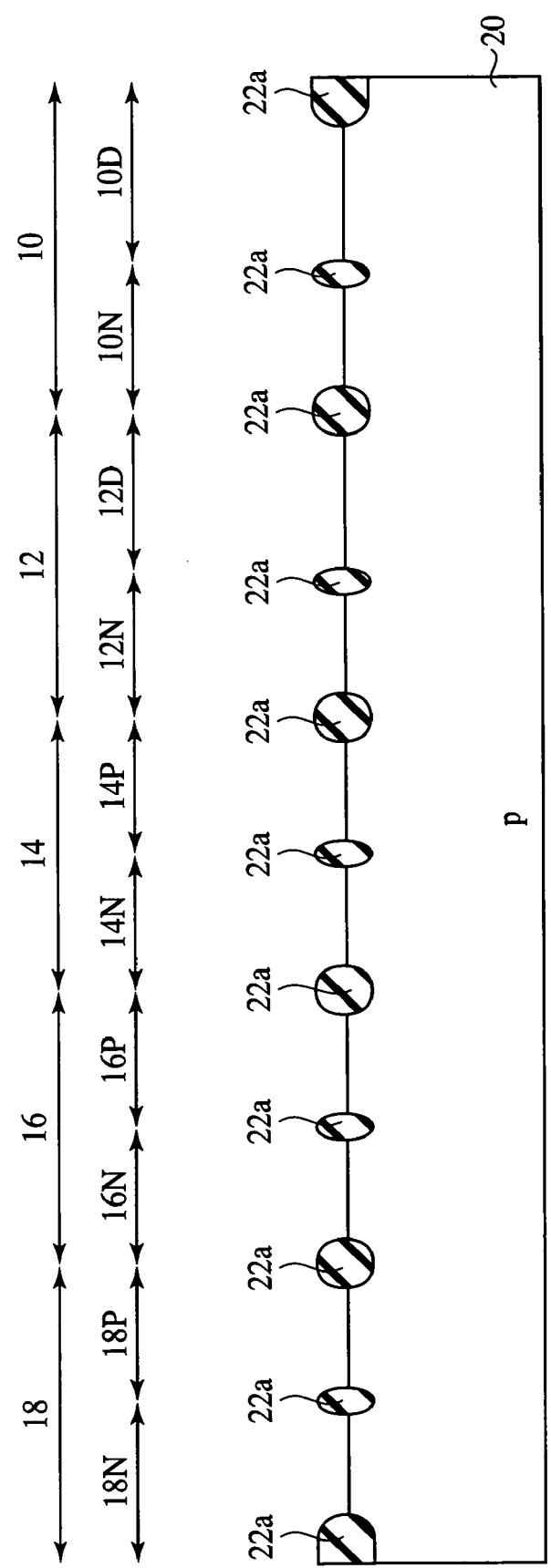
FIG. 25 is a sectional view of the solid-state image sensor according to the second embodiment of the present invention, in the steps of the method for fabricating the solid-state image sensor, which illustrates the method (Part 3).

Next, as illustrated in FIG. 24, a photoresist film 94 is formed on the entire surface by spin coating.

Then, openings 96 for exposing the regions for the device isolation regions 22a to be formed in are formed in the photoresist film 94 by photolithography.

Next, with the photoresist film 94 as the mask, the silicon nitride film 92 and the silicon oxide film 90 are etched. Then, the photoresist film 94 is released.

Then, the semiconductor substrate 20 is oxidized by thermal oxidation selectively at the parts which are not covered by the silicon nitride film 92. Thus, the device isolation regions 22a of the silicon oxide film are formed by LOCOS.

Next, the silicon nitride film 92 is etched off. The etchant is, e.g., boiled phosphoric acid (see FIG. 25).

The steps of the method for fabricating the solid-state image sensor according to the second embodiment, which will follow hereafter are the same as those of the method for fabricating the solid-state image sensor described above with reference to FIGS. 4 to 20, and their explanation will not be repeated.

Figure 26:
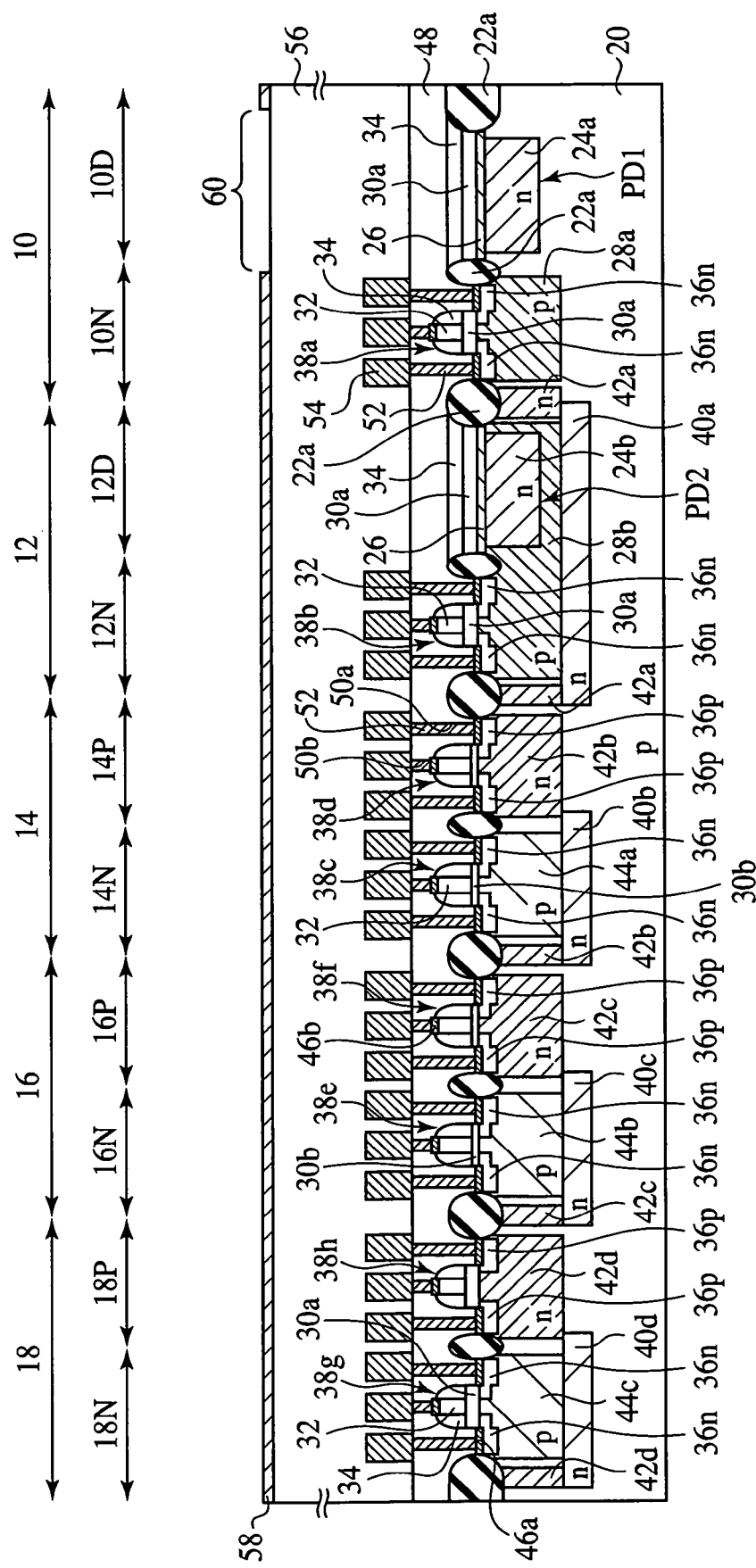
FIG. 26 is a sectional view of the solid-state image sensor according to the second embodiment of the present invention, in the steps of the method for fabricating the solid-state image sensor, which illustrates the method (Part 4).

Thus, the solid-state image sensor according to the present embodiment is fabricated (see FIG. 26).

(A Modification)

Figure 27:
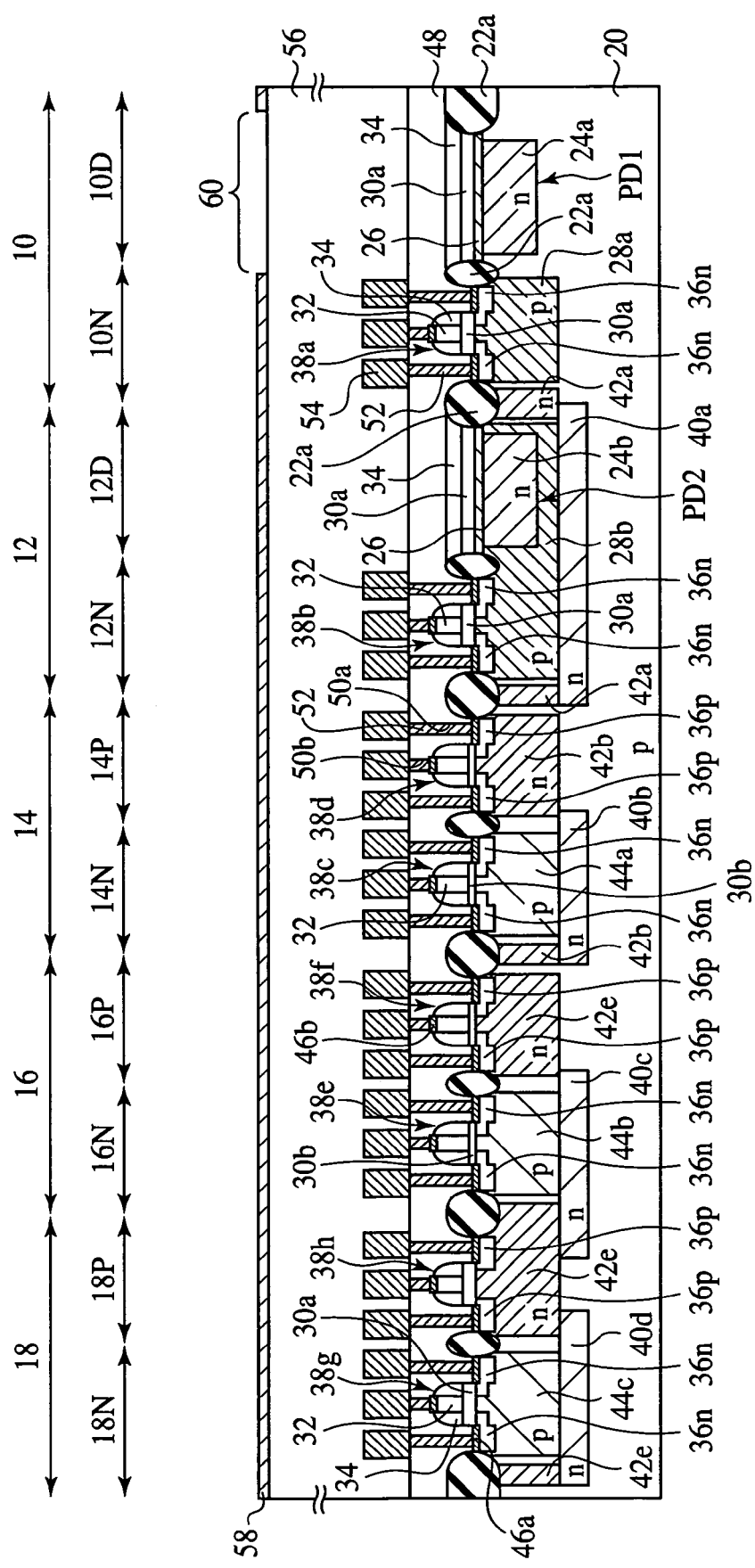
FIG. 27 is a sectional view of the solid-state image sensor according to a modification of the second embodiment of the present invention.

Next, the modification of the solid-state image sensor according to the present embodiment will be explained with reference to FIG. 27. FIG. 27 is a sectional view of the solid-state image sensor according to the present modification.

The solid-state image sensor according to the present modification is characterized mainly in that the N type well 42e of a digital circuit part 16 and the N type well 42e of an I/O circuit part 18 are formed integral with each other. In other words, the N type well 42e of the digital circuit part 16 and the N type well 42e of the I/O circuit 18 are formed continuous to each other.

Thus, the N type well 42e of the digital circuit part 16 and the N type well 42e of the I/O circuit part 18 may be formed integral with each other.

A Third Embodiment

Figure 28:
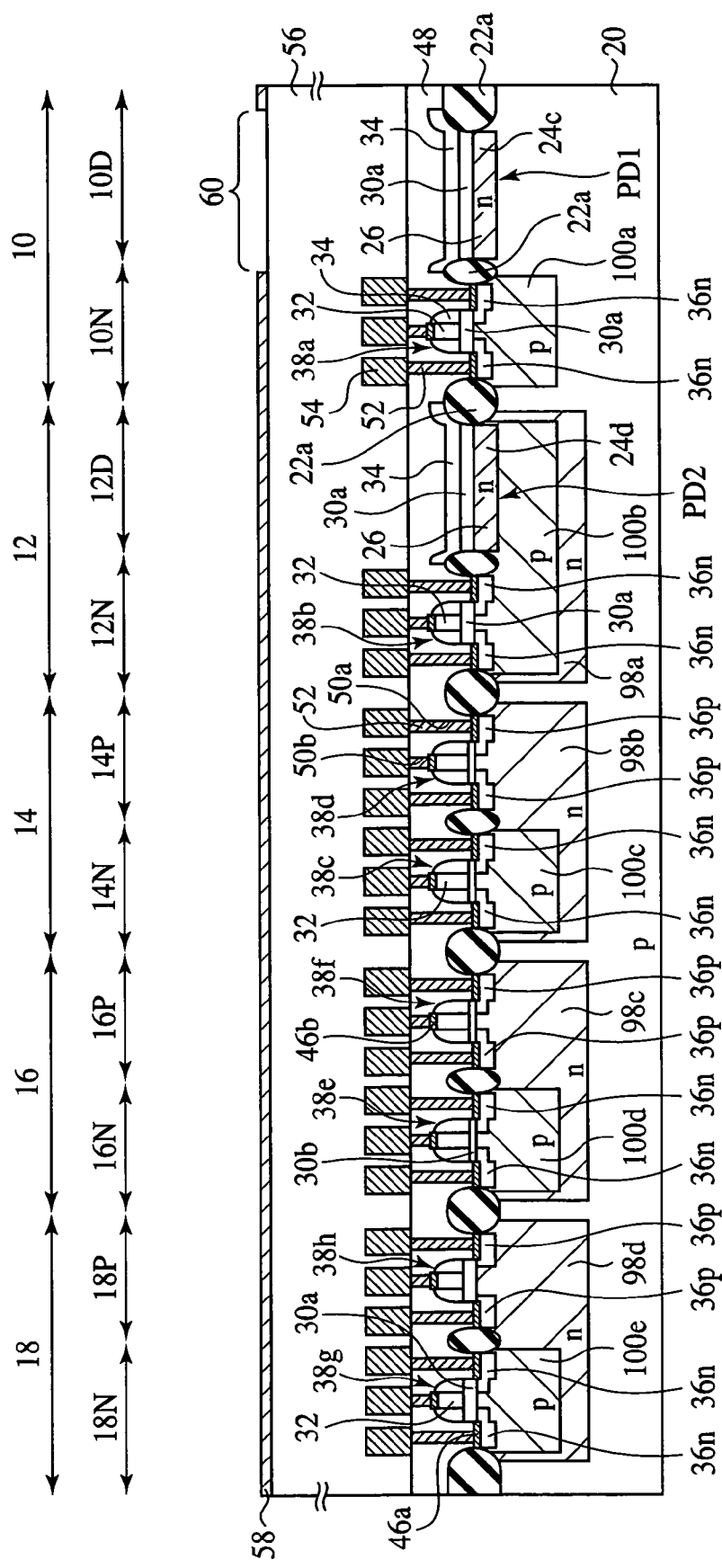
FIG. 28 is a sectional view of the solid-state image sensor according to a third embodiment of the present invention.

The solid-state image device according to a third embodiment of the present invention and the method for fabricating the solid-state image sensor will be explained with reference to FIGS. 28 to 36. FIG. 28 is a sectional view of the solid-state image sensor according to the present embodiment. The same members of present embodiments as those of the solid-state image sensor according to the first or the second embodiment and the method for fabricating the semiconductor device illustrated in FIGS. 1 to 27 are represented by the same reference numbers not to repeat or to simplify their explanation.

(The Solid State Image Sensor)

First, the solid-state image sensor according to the present embodiment will be explained with reference to FIG. 28.

The solid-state image sensor according to the present embodiment is characterized mainly in that a P type well is formed in an N type well to thereby form the triple structure.

As illustrated in FIG. 28, in a region 10D of a pixel array part 10, where a photodiode is formed, an N type impurity diffused region 24c is formed in a semiconductor substrate 20. The N type impurity diffused region 24c forms a photodiode PD1.

In a region 10N of the pixel array part 10, where an NMOS transistor is formed, a P type well 100a is formed. An NMOS transistor 38a is formed o the P type well 100a.

An N type well 98a is formed in the semiconductor substrate 20 of a black pixel array part 12. A P type well 100b is formed in the N type well 98a. The P type well 100b is formed by implanting a P type dopant impurity into the N type well 98a. The P type well 100b is formed in a region 12N where an NMOS transistor is formed and also in a region 12D where a photodiode PD2 is formed. The P type well 100b is electrically isolated from the pixel array part 10 by the N type well 98a.

In a region 12D of the black pixel array part 12, where a photodiode is formed, an N type impurity diffused region 24d is formed in the P type well 100b.

In the region 12N of the black pixel array part 12, where an NMOS transistor is formed, an NMOS transistor 38b is formed on the P type well 100b.

In the semiconductor substrate 20 of an analog circuit part 14, an N type well 98b is formed. The N type well 98b is formed in a region 14N where an NMOS transistor is formed and also in a region 14P where a PMOS transistor is formed. In the region 14N of the analog circuit part 14, where the NMOS transistor is formed, a P type well 100c is formed in the N type well 98b. The P type well 100c is formed by implanting a P type dopant impurity into the N type well 98b. The P type well 100c is electrically isolated from the pixel array part 10 by the N type well 98b. An NMOS transistor 38c is formed on the P type well 100c. In the region 14P of the analog circuit part 14, where the PMOS transistor is formed, a PMOS transistor 38d is formed on the N type well 98b.

In the semiconductor substrate 20 of a digital circuit part 16, an N type well 98c is formed. The N type well 98c is formed in a region 16N where an NMOS transistor is formed and also in a region 16P where a PMOS transistor is formed. In the region 16N of the digital circuit part 16, where the NMOS transistor is formed, a P type well 100d is formed in the N type well 98c. The P type well 100d is formed by implanting a P type dopant impurity into the N type well 98c. The P type well 100d is electrically isolated from the pixel array part 10 by the N type well 98c. An NMOS transistor 38e is formed on the P type well 100d. In the region 16P of the digital circuit part 16, where the PMOS transistor is formed, a PMOS transistor 38f is formed on the N type well 98c.

In the semiconductor substrate 20 of an I/O circuit part 18, an N type well 98d is formed. The N type well 98d is formed in a region 18N where an NMOS transistor is formed and also in a region 18P where a PMOS transistor is formed. In the region 18N of the I/O circuit part 18, where the NMOS transistor is formed, a P type well 100e is formed in the N type well 98d. The P type well 100e is formed by implanting a P type dopant impurity into the N type well 98d. The P type well 100e is electrically isolated from the pixel array part 10 by the N type well 98d. An NMOS transistor 38g is formed on the P type well 100e. In the region 18P of the I/O circuit part 18, where the PMOS transistor is formed, a PMOS transistor 38h is formed on the N type well 98d.

Thus, the solid-state image sensor according to the present embodiment is formed.

Thus, the P type well 100b–100e are formed by implanting P type dopant impurity into the N type well 98a–98d.

(The Method for Fabricating the Solid-State Image Sensor)

Then, the method for fabricating the solid-state image sensor according to the present embodiment will be explained with reference to FIGS. 29 to 36. FIGS. 29 to 36 are sectional views of the solid-state image sensor according to the present embodiment in the steps of the method for fabricating the solid-state image sensor, which illustrate the method.

Figure 29:
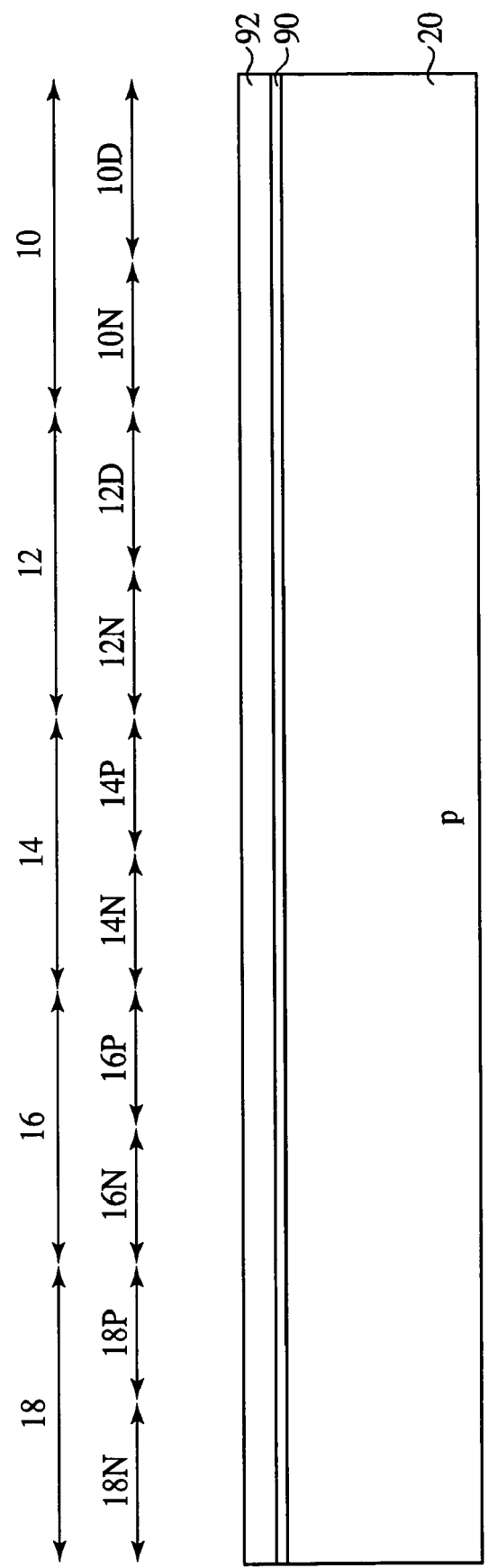
FIG. 29 is a sectional view of the solid-state image sensor according to the third embodiment of the present invention, in the steps of the method for fabricating the solid-state image sensor, which illustrates the method (Part 1).

First, as illustrated in FIG. 29, a 3–10 nm-thickness silicon oxide film 90 is formed on the entire surface by, e.g., thermal oxidation.

Next, a 100–150 nm-thickness silicon nitride film 92 is formed on the entire surface by, e.g., CVD.

Figure 30:
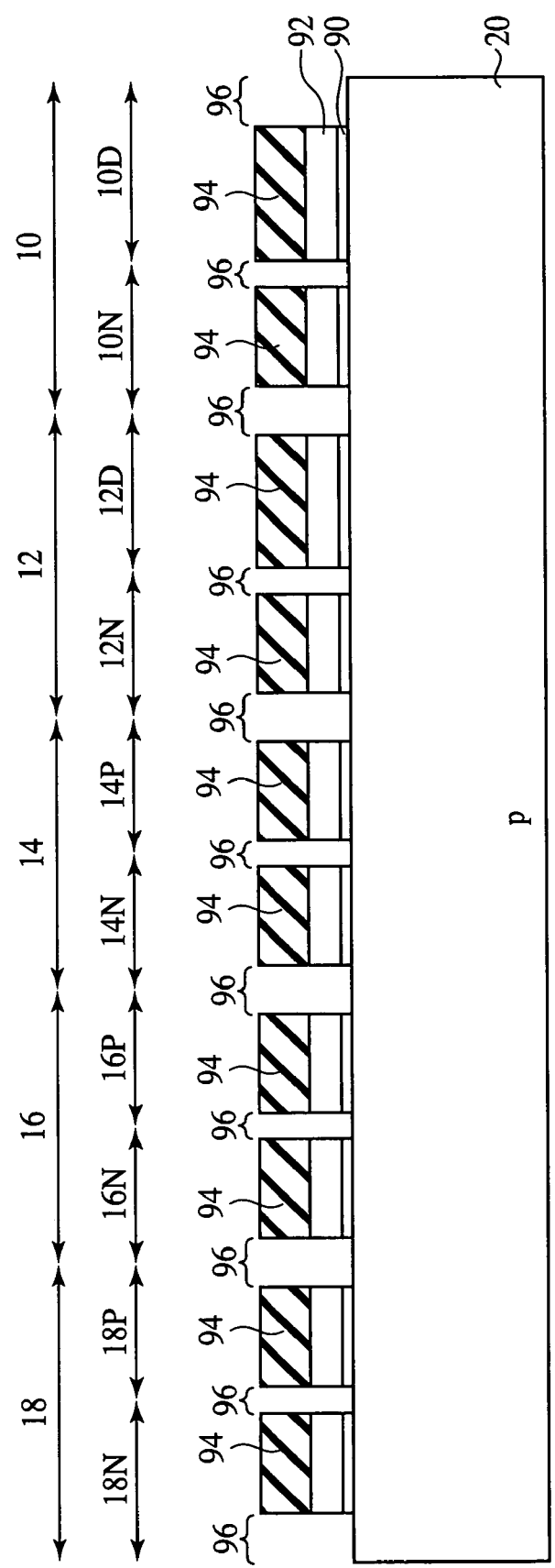
FIG. 30 is a sectional view of the solid-state image sensor according to the third embodiment of the present invention, in the steps of the method for fabricating the solid-state image sensor, which illustrates the method (Part 2).

Then, as illustrated in FIG. 30, a photoresist film 94 is formed on the entire surface by spin coating.

Then, openings 96 for exposing the regions where device isolation regions 22a are to be formed are formed in the photoresist film 94 by photolithography.

Then, with the photoresist film 94 as the mask, the silicon nitride film 92 and the silicon oxide film 90 are etched. Then, the photoresist film 94 is released.

Figure 31:
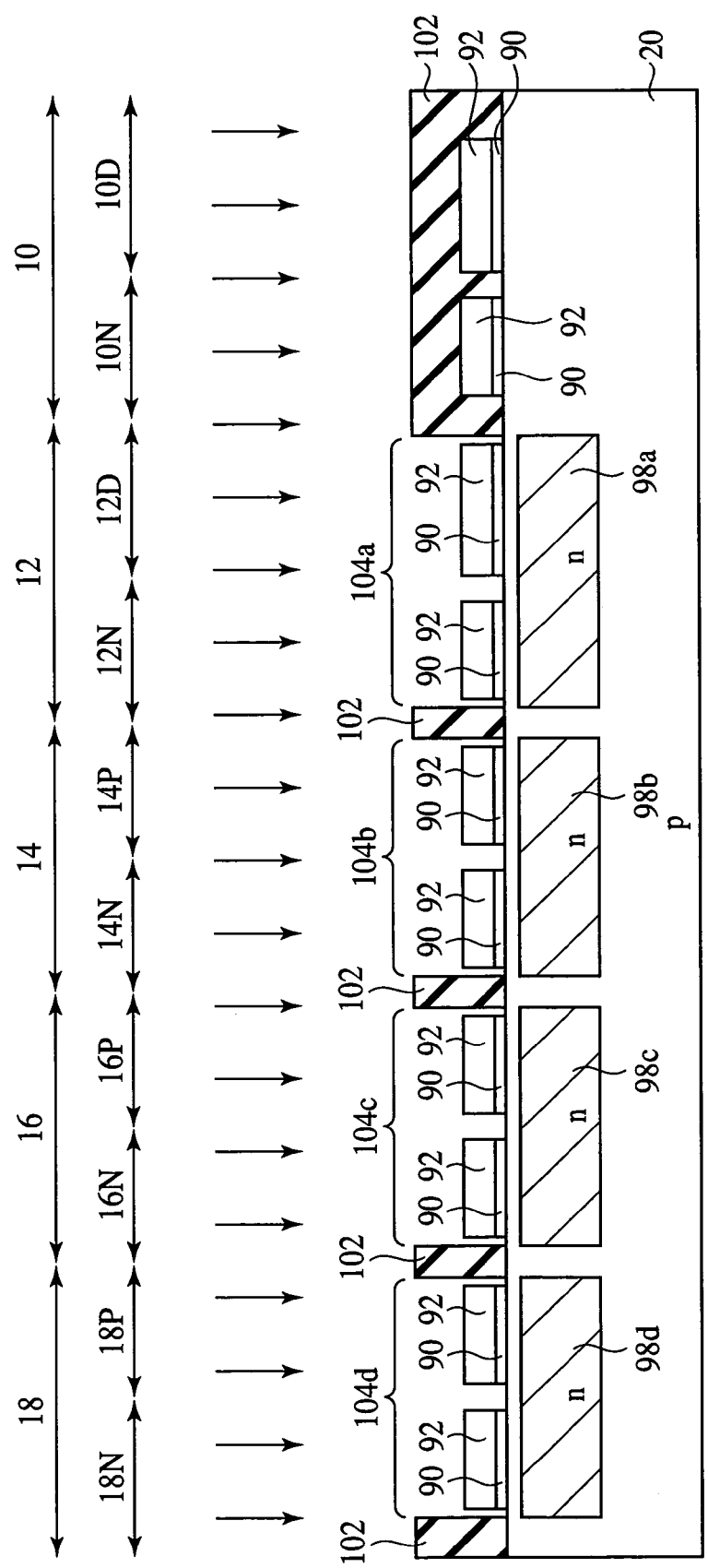
FIG. 31 is a sectional view of the solid-state image sensor according to the third embodiment of the present invention, in the steps of the method for fabricating the solid-state image sensor, which illustrates the method (Part 3).
Figure 32:
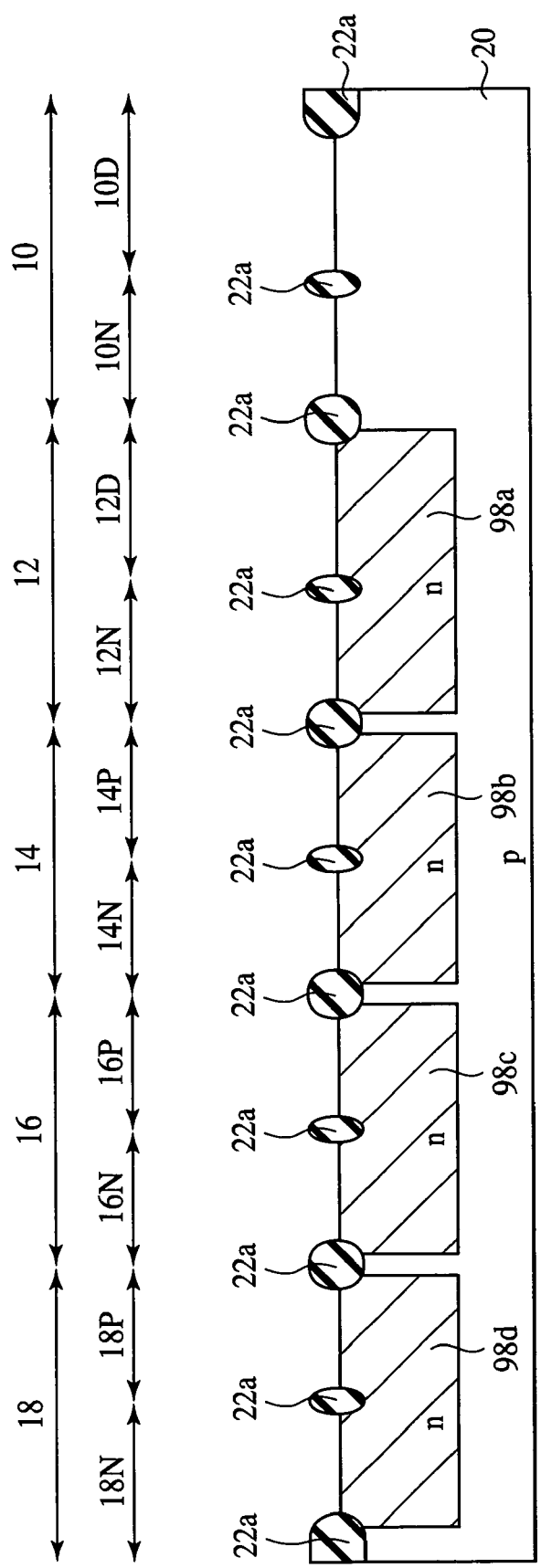
FIG. 32 is a sectional view of the solid-state image sensor according to the third embodiment of the present invention, in the steps of the method for fabricating the solid-state image sensor, which illustrates the method (Part 4).

Next, as illustrated in FIG. 31, a photoresist film 102 is formed on the entire surface by pin coating.

Then, an opening 104a for exposing the region 12, where the black array pixel array part is to be formed, an opening 104b for exposing the region 14, where the analog circuit part is to be formed, an opening 104c for exposing the region 16, where the digital circuit part is to be formed, and an opening 104d for exposing the region 18, where the I/O circuit part is to be formed are formed in the photoresist film 102 by photolithography.

Then, an N type dopant impurity is introduced into the semiconductor substrate 20 by ion implantation with the photoresist film 102 as the mask. Conditions for the ion implantation are, e.g., a 150–300 keV acceleration energy and a $1 \times 10^{13}$–$5 \times 10^{13}$ cm$^{-2}$ dose. Thus, the N type wells 98a–98d are formed in the semiconductor substrate. Then, the photoresist film 102 is released.

Next, thermal processing is performed to diffuse the dopant impurity in the N type wells 98a–98d. The atmosphere for the thermal processing is, e.g., nitrogen atmosphere. The thermal processing temperature is, e.g., 1100° C. The thermal processing period of time is, e.g., 100 minutes.

Then, the semiconductor substrate 20 is oxidized by thermal oxidation selectively at the parts thereof which are not covered by the silicon nitride film 92. Thus, the device isolation regions 22a of the silicon oxide film are formed. Thus, the device isolation regions 22a are formed by LOCOS (see FIG. 32). By the thermal process in the nitrogen atmosphere and the thermal processing for forming the device isolation regions 22a, the N type wells 98a–98d are formed down to, e.g., an bout 3 μm-depth from the surface of the semiconductor substrate 20.

Next, the silicon nitride film 92 is etched off. The etchant is, e.g., boiled phosphoric acid.

The device isolation regions 22a are formed here after the thermal processing for diffusing the N type dopant impurity implanted in the N type wells 98a–98d has been performed, but the thermal processing for diffusing the N type dopant impurity may be performed after the device isolation regions 22a have been formed.

Figure 33:
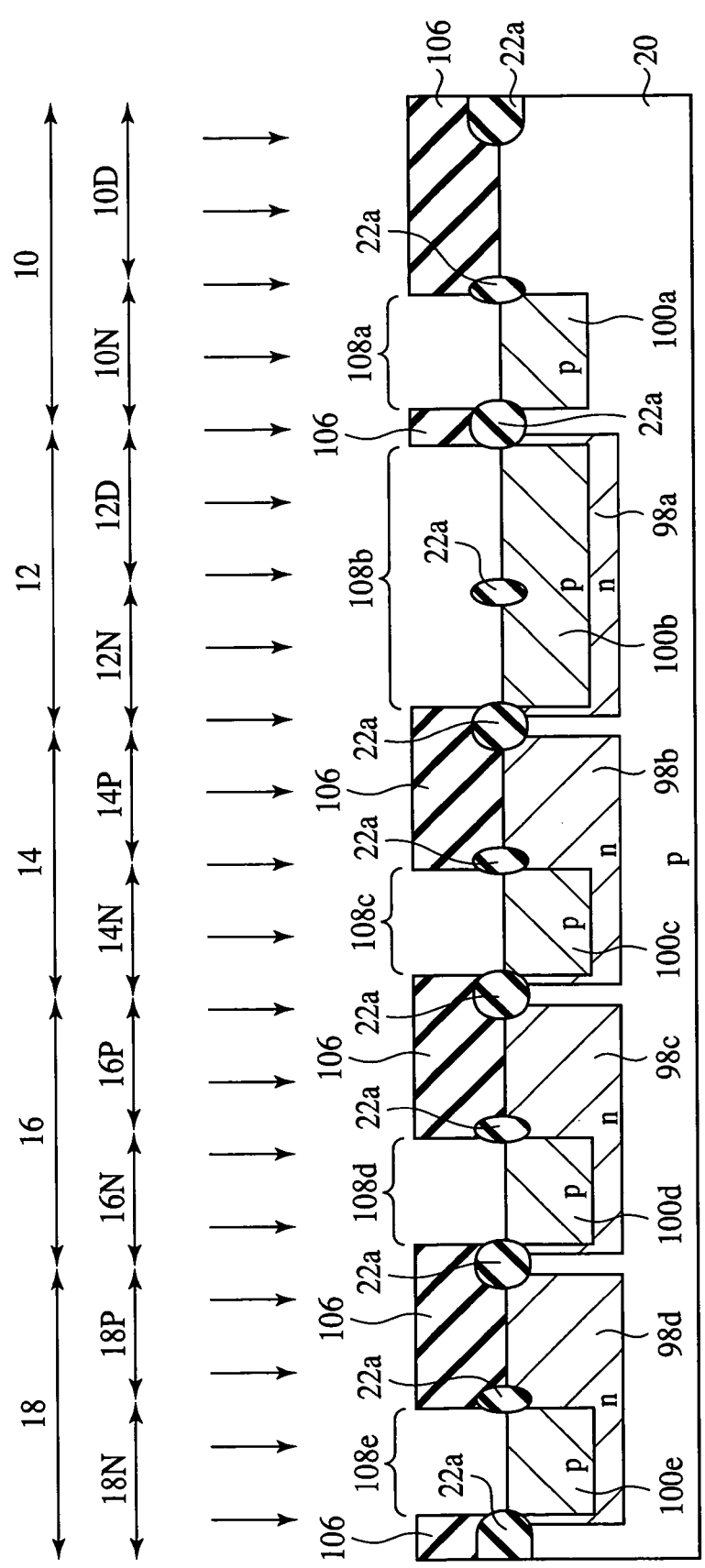
FIG. 33 is a sectional view of the solid-state image sensor according to the third embodiment of the present invention, in the steps of the method for fabricating the solid-state image sensor, which illustrates the method (Part 5).

Then, as illustrated in FIG. 33, a photoresist film 106 is formed on the entire surface by spin coating.

Next, the photoresist film 106 is patterned by photolithography. Thus, the opening 108a for exposing the region 10N of the pixel array part 10, where the NMOS transistor is to be formed, the openings 108b for exposing the black pixel array part 12, the opening 108c for exposing the region 14N of the analog circuit 14, where the NMOS transistor is to be formed, the opening 108d for exposing the region 16N of the digital circuit part 16, where the NMOS transistor is to be formed, and the opening 108e for exposing the region 18N of the I/O circuit part 18, where the NMOS transistor is to be formed are formed in the photoresist film 106.

Then, a P type dopant impurity is introduced into the semiconductor substrate 20 by ion implantation with the photoresist film 106 as the mask. The P type dopant impurity is, e.g., boron. Conditions for the ion implantation are, e.g., a 100–300 keV acceleration energy and a $1 \times 10^{13}$–$5 \times 10^{13}$ cm$^{-2}$ dose.

Then, a threshold voltage control layer (not illustrated) for controlling threshold voltages of the NMOS transistors 38a–38c, 30e, 38g may be formed by using the photoresist film 106 before the photoresist film 106 is released. In forming the threshold voltage control layer, with the photoresist film 106 as the mask, a P type dopant impurity is introduced by ion implantation into regions of the semiconductor substrate 20 which are relatively shallow. The P type dopant impurity is, e.g., boron. Conditions for the ion implantation are, e.g., a 50 keV acceleration energy or below, and a $1 \times 10^{12}$–$7 \times 10^{12}$ cm$^{-2}$ dose. Then, the photoresist film 106 is released.

Figure 11:
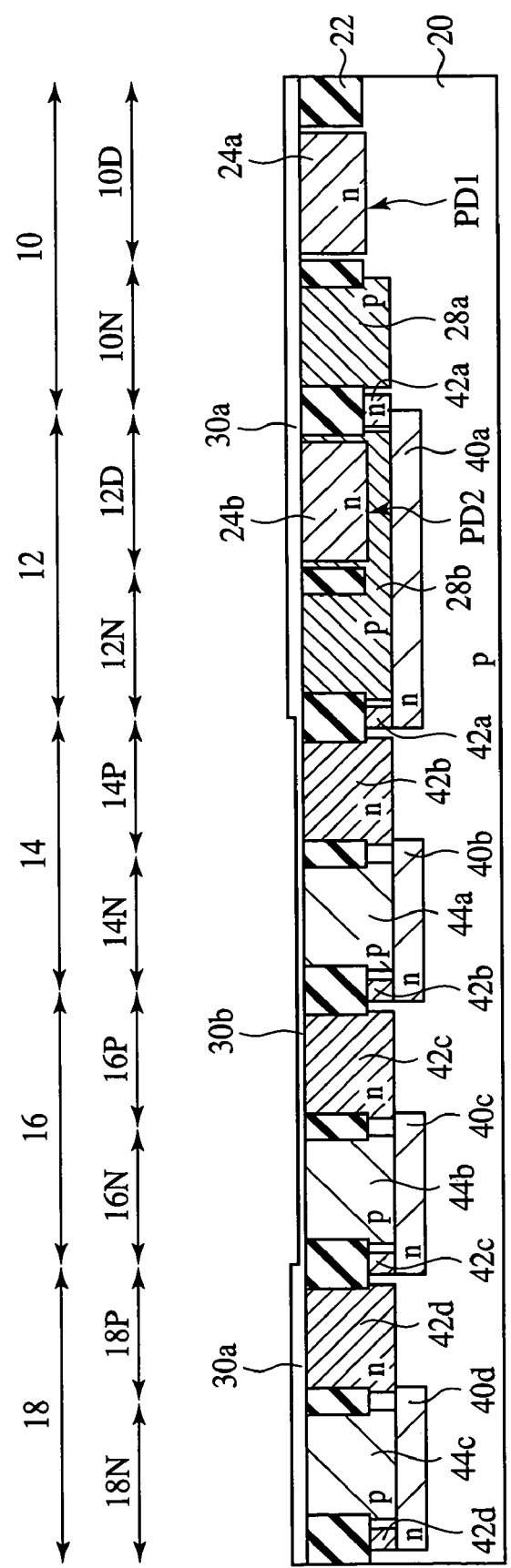
FIG. 11 is a sectional view of the solid-state image sensor according to the first embodiment of the present invention, in the steps of the method for fabricating the solid-state image sensor, which illustrates the method (Part 9).
Figure 34:
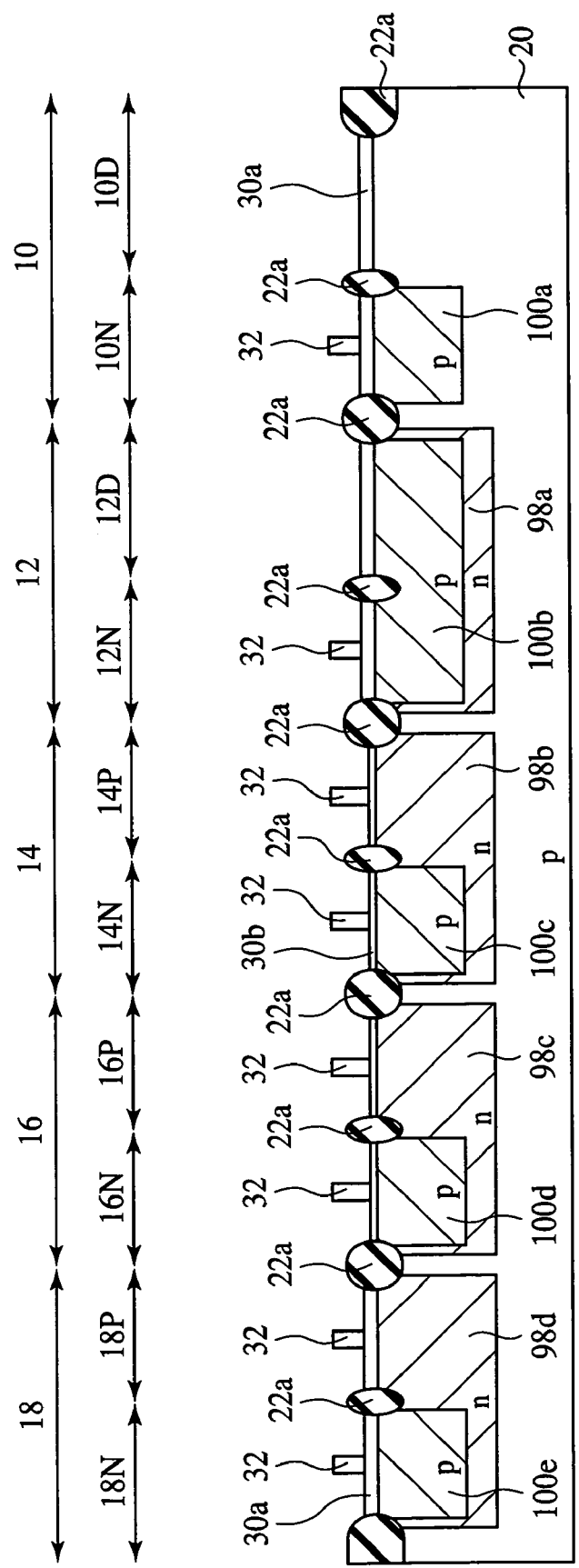
FIG. 34 is a sectional view of the solid-state image sensor according to the third embodiment of the present invention, in the steps of the method for fabricating the solid-state image sensor, which illustrates the method (Part 6).

Then, in the same way as in the method for fabricating the solid-state image sensor illustrated in FIGS. 9 to 11, a relatively thick gate insulation film 30a is formed in the pixel array part 10, the black pixel array part 12 and the I/O circuit part 18, and the relatively thin gate insulation film 30b is formed in the digital circuit part 14 and the analog circuit part 16 (see FIG. 34).

A threshold voltage control layer (not illustrated) for controlling threshold voltages of the transistors 38 may be formed by implanting a dopant impurity into the entire surface of the semiconductor substrate 20 before or immediately after the step of forming the gate insulation film 30a, 30b. The dopant impurity is, e.g., boron. Conditions for the ion implantation are, e.g., a 50 keV acceleration energy or below, and a $1 \times 10^{12}$–$7 \times 10^{12}$ cm$^{-2}$ dose.

Next, in the same way as in the method for fabricating the solid-state image sensor illustrated in FIGS. 12 and 13, the gate electrodes 32 is formed.

Figure 35:
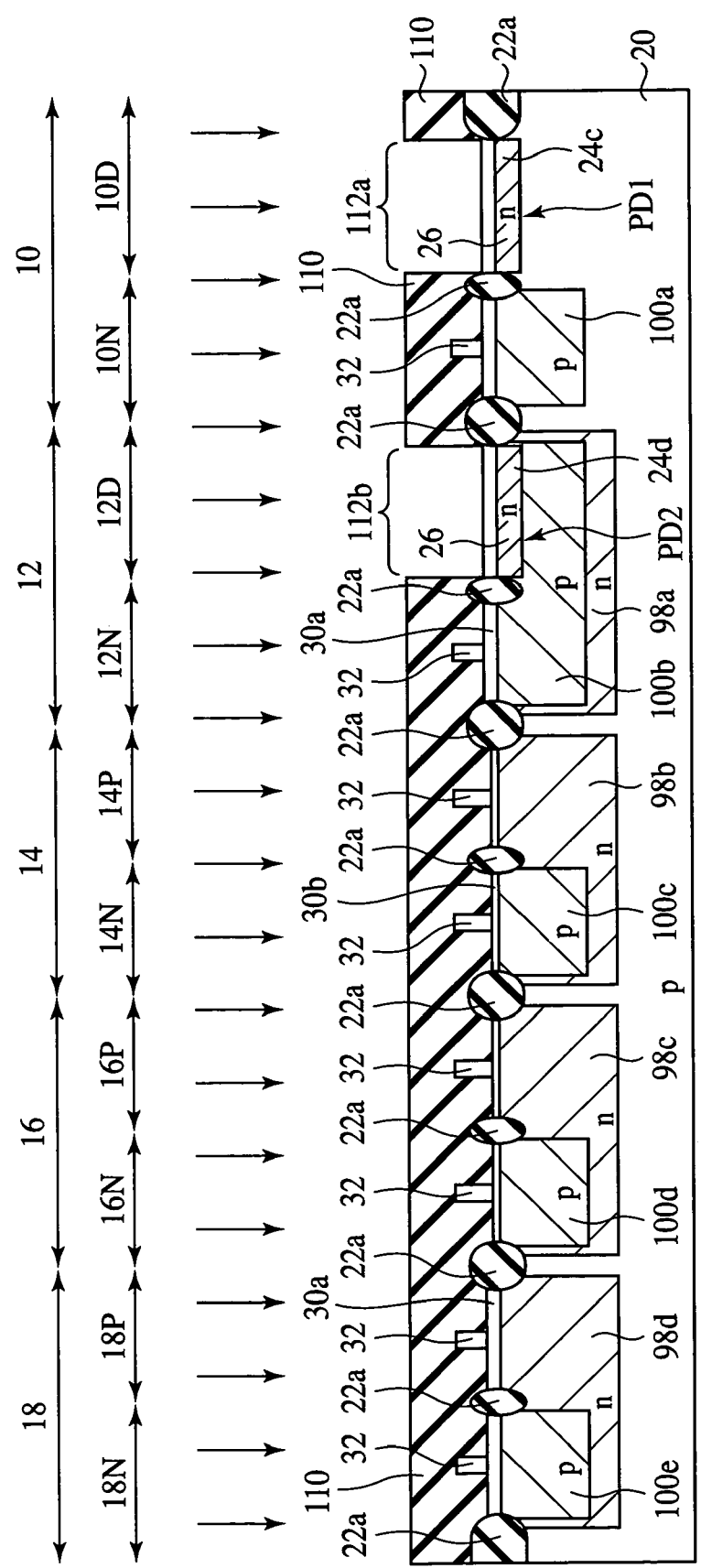
FIG. 35 is a sectional view of the solid-state image sensor according to the third embodiment of the present invention, in the steps of the method for fabricating the solid-state image sensor, which illustrates the method (Part 7).

Then, as illustrated in FIG. 35, a photoresist film 110 is formed on the entire surface by spin coating.

Then, the photoresist film 110 is patterned by photolithography. Thus, in the photoresist film 110, an opening 112a for exposing the region 10D of the pixel array part 10, where the photodiode is to be formed, and an opening 112b for exposing the region 12D of the black pixel array part 12, where the photodiode is to be formed.

Next, an N type dopant impurity is introduced by ion implantation with the photoresist film 110 as the mask. The dopant impurity is, e.g., phosphorus. Conditions for the ion implantation are, e.g., a 20–500 keV acceleration energy and a $1 \times 10^{14}$–$5 \times 10^{15}$ cm$^{-2}$ dose. Thus, the N type impurity diffused regions 24c, 24d forming the photodiodes PD1, PD2 are formed. Then, the photoresist film 110 is released.

The following steps of the method for fabricating the solid-state image sensor are the same as those of the method for fabricating the solid-state image sensor described above with reference to FIGS. 15 to 20, and their explanation will not be repeated.

Figure 36:
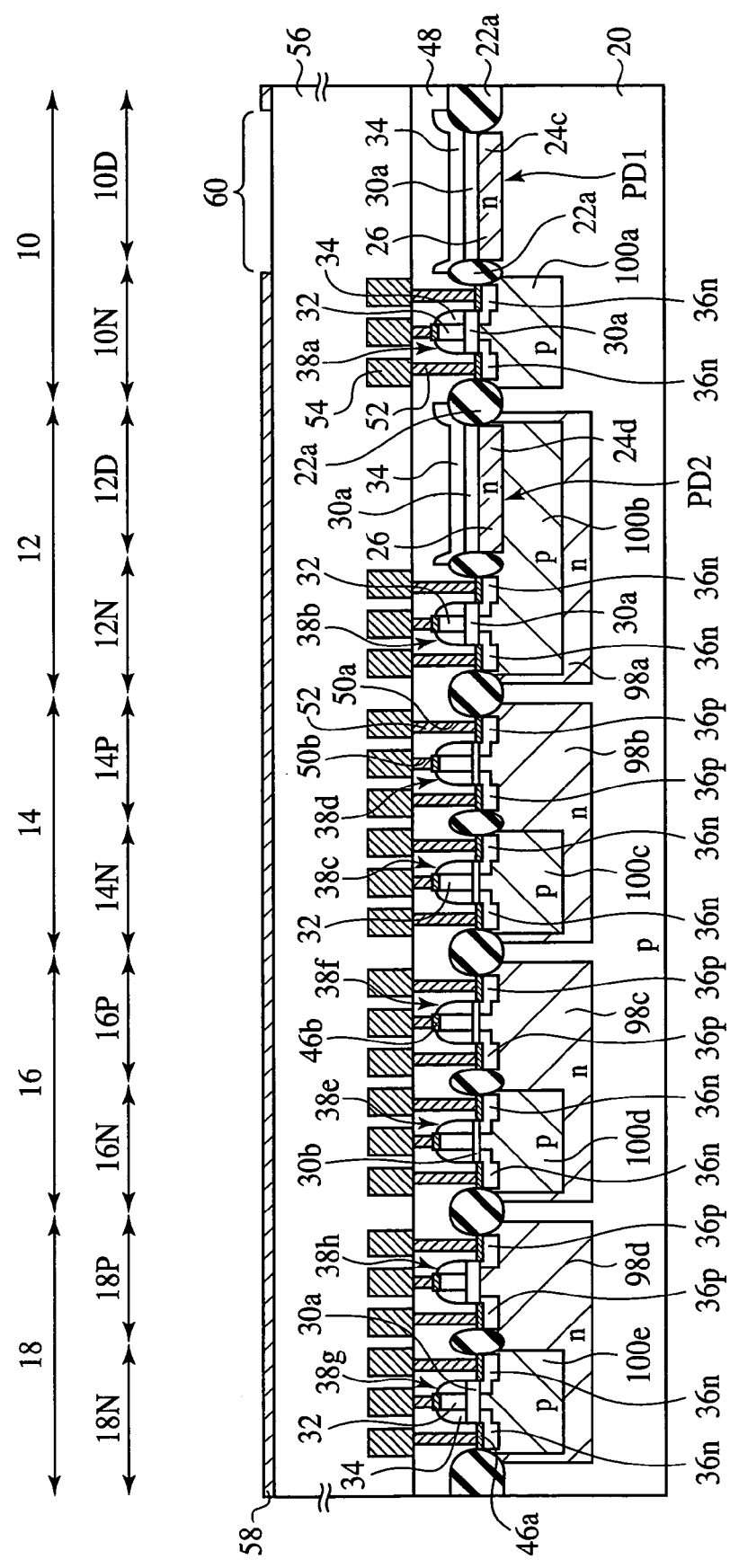
FIG. 36 is a sectional view of the solid-state image sensor according to the third embodiment of the present invention, in the steps of the method for fabricating the solid-state image sensor, which illustrates the method (Part 8).

Thus, the solid-state image sensor according to the present embodiment is fabricated (see FIG. 36).

(A Modification)

Figure 37:
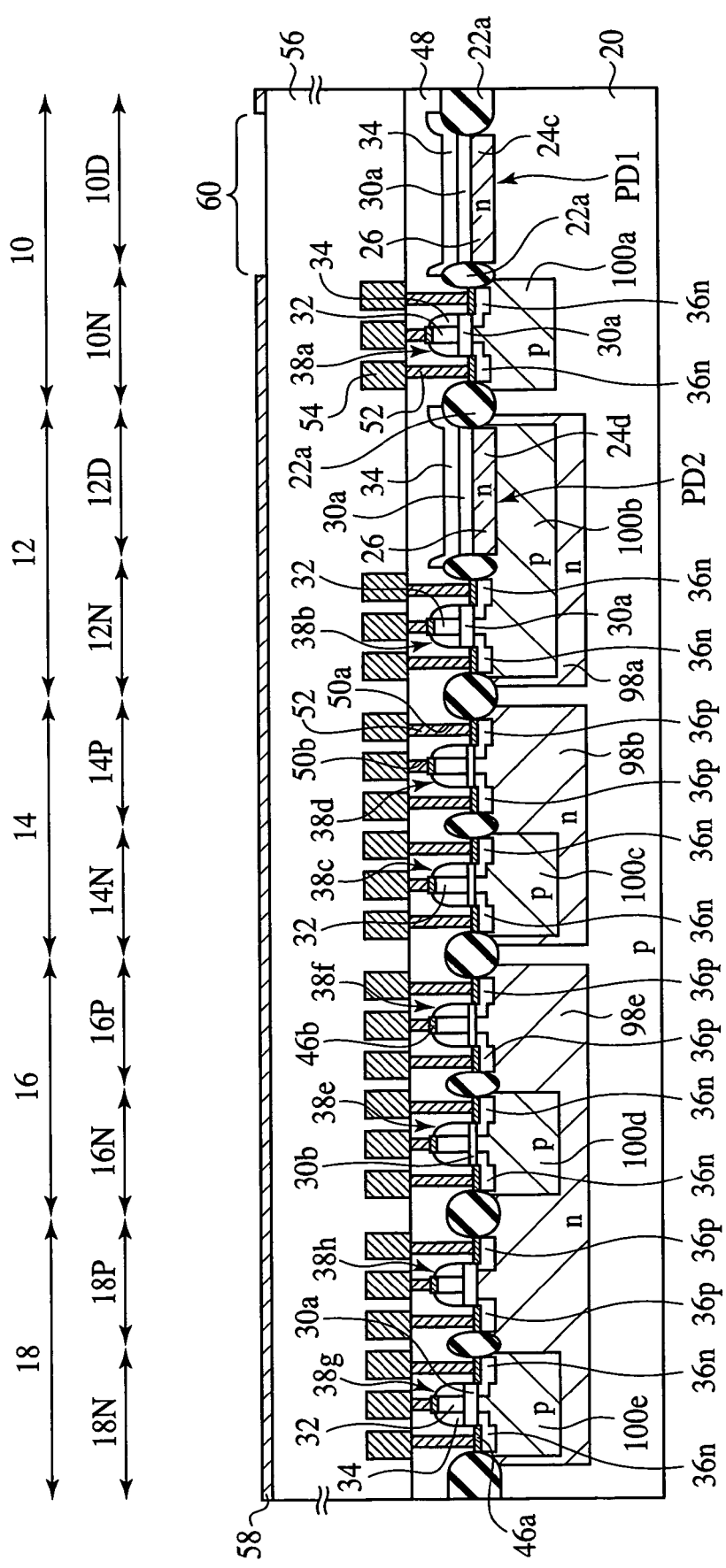
FIG. 37 is a sectional view of the solid-state image sensor according to a modification of the third embodiment of the present invention.

Next, the solid-state image sensor according to the present embodiment will be explained with reference to FIG. 37. FIG. 37 is a sectional view of the solid-state image sensor according to the present modification.

The solid-state image sensor according to the present modification is characterized mainly in that the N type well 98e of the digital circuit part 16 and the N type well 98e of the I/O circuit part 18 are formed integral with each other. In other words, the N type well 98e of the digital circuit part 16 and the N type well 98e of the I/O circuit part 18 are formed continuous to each other.

Thus, the N type well 98e of the digital circuit part 16 and the N type well 98e of the I/O circuit part 18 may be formed integral with each other.

Modified Embodiments

The present invention is not limited to the above-described embodiments and can cover other various modifications.

For example, in the above-described embodiments, the semiconductor substrate 20 is a P type semiconductor substrate. However, the semiconductor substrate 20 may be an N type semiconductor substrate, and in this case, the conduction types of the respective components are set oppositely.

What is claimed is:

1. A solid-state image sensor comprising: a pixel part including photoelectric converter for photoelectrically converting incident light, which is formed in a semiconductor substrate of a first conduction type; an analog circuit part for processing an analog signal outputted by the pixel part; a digital circuit part for digital processing a signal outputted by the analog circuit part; and an input/output circuit part for inputting a signal to an outside or outputting a signal from the outside;

the digital circuit part including a first well of a second conduction type different from the first conduction type formed in a second region of the semiconductor substrate surrounding a first region thereof, a first buried diffused layer of the second conduction type buried in the semiconductor substrate in the first region and connected to the first well at the side thereof, a second well of the first conduction type formed near a surface of the semiconductor substrate of the first region; and a first transistor formed on the second well; and the input/output circuit part including a third well of the second conduction type formed in a fourth region of the semiconductor substrate surrounding a third region, a second buried diffused layer of the second conduction type buried in the semiconductor substrate in the third region and connected to the third well at the side thereof, a fourth well of the first conduction type formed near the surface of the semiconductor substrate in the third region, and a second transistor formed on the fourth well.

2. A solid-state image sensor according to claim 1, wherein the analog circuit part includes a fifth well of the second conduction type formed in a sixth region of the semiconductor substrate surrounding a fifth region thereof; a third buried diffused layer of the second conduction type buried in the semiconductor substrate in the fifth region and connected to the fifth well at the side thereof; a sixth well of the first conduction type formed near the surface of the semiconductor substrate in the third region; and a third transistor formed on the sixth well.

3. A solid-state image sensor according to claim 1, further comprising another pixel part including a fifth well of the second conduction type formed in a sixth region of the semiconductor substrate surrounding the fifth region thereof; a third buried diffused layer of the second conduction type buried in the semiconductor substrate in the fifth region and connected to the fifth well at the side thereof; a sixth well of the first conduction type formed near the surface of the semiconductor substrate in the fifth region; and another photoelectric converter formed in the sixth well and shielded from light.

4. A solid-state image sensor comprising: a pixel part including photoelectric converter for photoelectrically converting incident light, which is formed in a semiconductor substrate of a first conduction type; an analog circuit part for processing an analog signal outputted by the pixel part; a digital circuit part for digital processing a signal outputted by the analog circuit part; and an input/output circuit part for inputting a signal to an outside or outputting a signal from the outside, the digital circuit part including a first well of a second conduction type different from the first conduction type formed in the semiconductor substrate; a second well of the first conduction type formed in the first well; and a first transistor formed on the second well; and the input/output circuit part including a third well of the second conduction type formed in the semiconductor substrate; a fourth well of the first conduction type formed in the third well; and a second transistor formed on the fourth well.

5. A solid-state image sensor according to claim 4, wherein the analog circuit part includes a fifth well of the second conduction type formed in the semiconductor substrate; a sixth well of the first conduction type formed in the fifth well; and a third transistor formed on the sixth well.

6. A solid-state image sensor according to claim 4, further comprising a fifth well of the second conduction type formed in the semiconductor substrate; a sixth well of the first conduction type formed in the fifth well; and another photoelectric converter formed in the sixth well and shielded from light.

7. A solid-state image sensor according to claim 1, wherein the first well and the third well are formed integral with each other.

8. A solid-state image sensor according to claim 4, wherein the first well and the third well are formed integral with each other.

9. A solid-state image sensor according to claim 1, further comprising:

a third transistor formed on the first well; and
a fourth transistor formed on the third well.

10. A solid-state image sensor according to claim 4, further comprising:

a third transistor formed on the first well; and
a fourth transistor formed on the third well.

11. A solid-state image sensor according to claim 2, further comprising a fourth transistor formed on the fifth well.

12. A solid-state image sensor according to claim 5, further comprising a fourth transistor formed on the fifth well.

13. A solid-state image sensor according to claim 3, further comprising a third transistor formed on the sixth well.

14. A solid-state image sensor according to claim 6, further comprising a third transistor formed on the sixth well.

* * * * *